United States Patent
Imai et al.

(10) Patent No.: US 7,932,996 B2
(45) Date of Patent: Apr. 26, 2011

(54) EXPOSURE APPARATUS, EXPOSURE METHOD, AND DEVICE FABRICATION METHOD

(75) Inventors: Motokatsu Imai, Yokohama (JP); Susumu Makinouchi, Zama (JP)

(73) Assignee: Nikon Corporation, Tokyo (JP)

( * ) Notice: Subject to any disclaimer, the term of this patent is extended or adjusted under 35 U.S.C. 154(b) by 581 days.

(21) Appl. No.: 11/407,210

(22) Filed: Apr. 20, 2006

(65) Prior Publication Data

US 2007/0002299 A1 Jan. 4, 2007

Related U.S. Application Data

(63) Continuation of application No. PCT/JP2004/015796, filed on Oct. 25, 2004.

(30) Foreign Application Priority Data

Oct. 28, 2003 (JP) .............................. P2003-366914

(51) Int. Cl.
*G03B 27/52* (2006.01)
(52) U.S. Cl. .......................................... 355/55; 355/72
(58) Field of Classification Search .................... 355/72, 355/53, 55
See application file for complete search history.

(56) References Cited

U.S. PATENT DOCUMENTS

| | | | |
|---|---|---|---|
| 4,346,164 A | 8/1982 | Tabarelli et al. | |
| 4,480,910 A | 11/1984 | Takanashi et al. | |
| 5,528,118 A | 6/1996 | Lee | |
| 5,610,683 A | 3/1997 | Takahashi | |
| 5,715,039 A | 2/1998 | Fukuda et al. | |
| 5,825,043 A | 10/1998 | Suwa | |
| 5,874,820 A | 2/1999 | Lee | |
| 5,969,441 A | 10/1999 | Loopstra et al. | |
| 6,341,007 B1 | 1/2002 | Nishi et al. | |
| 6,809,794 B1 * | 10/2004 | Sewell | 355/30 |
| 6,867,844 B2 | 3/2005 | Vogel et al. | |
| 6,952,253 B2 | 10/2005 | Lof et al. | |
| 7,251,017 B2 | 7/2007 | Novak et al. | |
| 7,321,415 B2 | 1/2008 | Hazelton et al. | |
| 2004/0165159 A1 | 8/2004 | Lof et al. | |
| 2005/0073670 A1 | 4/2005 | Carroll | |
| 2005/0217137 A1 | 10/2005 | Smith et al. | |
| 2006/0139614 A1 * | 6/2006 | Owa et al. | 355/72 |

(Continued)

FOREIGN PATENT DOCUMENTS

DE 221 563 A1 4/1985

(Continued)

OTHER PUBLICATIONS

Translation of Japanese Patent Application Publication No. 4-305915, Oct. 28, 1992.

(Continued)

*Primary Examiner* — Scott Kastler
(74) *Attorney, Agent, or Firm* — Oliff & Berridge, PLC

(57) ABSTRACT

An exposure apparatus forms an immersion area by supplying a liquid onto a part of a substrate, and forms a prescribed pattern on the substrate through the liquid. A spare immersion area, which is capable of holding part of the liquid on the substrate, is formed at the outer circumference of the immersion area. It is possible to prevent the separation of the liquid, which is disposed between a lower surface of a projection optical system and a substrate surface, from the lower surface of the projection optical system in accordance with the relative movement of the projection optical system and the substrate.

23 Claims, 10 Drawing Sheets

U.S. PATENT DOCUMENTS

| | | | |
|---|---|---|---|
| 2006/0227312 A1* | 10/2006 | Owa et al. | 355/72 |
| 2006/0261288 A1 | 11/2006 | Van Santen | |
| 2007/0002299 A1* | 1/2007 | Imai et al. | 355/55 |

FOREIGN PATENT DOCUMENTS

| | | |
|---|---|---|
| DE | 224 448 A1 | 7/1985 |
| JP | A 58-202448 | 11/1983 |
| JP | A 59-19912 | 2/1984 |
| JP | A 62-65326 | 3/1987 |
| JP | A 63-157419 | 6/1988 |
| JP | A 4-305915 | 10/1992 |
| JP | A 4-305917 | 10/1992 |
| JP | A-5-62877 | 3/1993 |
| JP | A 5-62877 | 3/1993 |
| JP | A 6-124873 | 5/1994 |
| JP | A 6-188169 | 7/1994 |
| JP | A-7-220990 | 8/1995 |
| JP | A 7-220990 | 8/1995 |
| JP | 8-166475 | 6/1996 |
| JP | A 8-316125 | 11/1996 |
| JP | A-8-316125 | 11/1996 |
| JP | A 8-330224 | 12/1996 |
| JP | A 10-163099 | 6/1998 |
| JP | WO 98/28665 | 7/1998 |
| JP | A 10-214783 | 8/1998 |
| JP | A-10-303114 | 11/1998 |
| JP | A 10-303114 | 11/1998 |
| JP | A-10-340846 | 12/1998 |
| JP | A 10-340846 | 12/1998 |
| JP | A 11-135400 | 5/1999 |
| JP | A-11-176727 | 7/1999 |
| JP | A 11-176727 | 7/1999 |
| JP | A-2000-058436 | 2/2000 |
| JP | A 2000-58436 | 2/2000 |
| JP | A 2000-505958 | 5/2000 |
| JP | A 2004-320016 | 11/2004 |
| JP | A-2004-320016 | 11/2004 |
| JP | A 2005-12228 | 1/2005 |
| WO | WO 99/49504 | 9/1999 |
| WO | WO 2004/019128 A2 | 3/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/090634 A2 | 10/2004 |
| WO | WO 2004/092833 A2 | 10/2004 |
| WO | WO 2005/024517 A2 | 3/2005 |

OTHER PUBLICATIONS

Translation of Japanese Patent Application Publication No. 4-305917, Oct. 28, 1992.
Translation of Japanese Patent Application Publication No. 63-157419, Jun. 30, 1988.
Translation of Japanese Patent Application Publication No. 58-202448, Nov. 25, 1983.
Translation of Japanese Patent Application Publication No. 59-19912, Feb. 1, 1984.
Translation of Japanese Patent Application Publication No. 62-65326, Mar. 24, 1987.
Supplementary European Search Report issued in European Patent Application No. 04792927.8 mailed on Jul. 4, 2008.
Office Action issued in European Patent Application No. 04792927.8 mailed on Nov. 21, 2008.
International Search Report issued in International Application No. PCT/JP2004/015796 mailed on Feb. 8, 2005 (w/English Translation).
Written Opinion of the International Searching Authority issued in International Application No. PCT/JP2004/015796 mailed on Feb. 8, 2005 (w/English Translation).
Office Action issued in Japanese Patent Application No. 2005-514993 mailed on Oct. 6, 2009 (w/English Translation).
Office Action issued in Japanese Patent Application No. 2005-514993 mailed on Jun. 8 , 2010 (w/English Translation).
Notice of Allowance issued in Japanese Patent Application No. 2005-514993 mailed on Sep. 7, 2010 (w/English Translation).

* cited by examiner

SCANNING DIRECTION

EXPOSURE APPARATUS, EXPOSURE METHOD, AND DEVICE FABRICATION METHOD

CROSS-REFERENCE TO RELATED APPLICATION

This is a Continuation Application of International Application No. PCT/JP2004/015796, filed Oct. 25, 2004, which claims priority to Japanese Patent Application No. 2003-366914 (filed Oct. 28, 2003). The contents of the aforementioned application are incorporated herein by reference.

BACKGROUND OF THE INVENTION

1. Field of the Invention

The present invention is a technology that relates to an exposure apparatus used in the transfer process of the lithographic process for manufacturing highly integrated semiconductor circuit devices.

2. Description of the Related Art

Semiconductor devices and liquid crystal display devices are fabricated by a so-called photolithography technique, wherein a pattern formed on a mask is transferred onto a photosensitive substrate. An exposure apparatus used in this photolithographic process has a mask stage that supports the mask, and a substrate stage that supports the substrate, and transfers the pattern of the mask onto the substrate through a projection optical system while successively moving the mask stage and the substrate stage.

There has been demanded in recent years for higher resolution projection optical systems in order to handle the much higher levels of integration of device patterns. The shorter the exposure wavelength used and the larger the numerical aperture of the projection optical system, the higher the resolution of the projection optical system. Consequently, the exposure wavelength used in exposure apparatuses has shortened year by year, and the numerical aperture of projection optical systems has increased. Furthermore, the mainstream exposure wavelength is currently the 248 nm assigned to KrF excimer laser, but an even shorter wavelength 193 nm assigned to ArF excimer laser is also being commercialized. In addition, as with resolution, the depth of focus (DOF) is important when performing exposure. The following equations express the resolution R and the depth of focus $\delta$, respectively.

$$R = k_1 \cdot \lambda/NA \quad (1)$$

$$\delta = \pm k_2 \cdot \lambda/NA^2 \quad (2)$$

Therein, $\lambda$ is the exposure wavelength, NA is the numerical aperture of the projection optical system, and $k_1$ and $k_2$ are the process coefficients. Equations (1) and (2) teach that if the exposure wavelength $\lambda$ is shortened and the numerical aperture NA is increased in order to enhance the resolution R, then the depth of focus $\delta$ decreases.

If the depth of focus $\delta$ becomes excessively narrow, then it will become difficult to make the surface of the substrate coincide with the image plane of the projection optical system, and there will be a risk of insufficient margin during the exposure operation. Accordingly, a liquid immersion method has been proposed, as disclosed in, for example, Reference Document 1 (PCT International Publication WO99/49504), as a method to substantially shorten the exposure wavelength and increase the depth of focus. In this liquid immersion method, a gap between the lower surface of the projection optical system and the surface of the substrate is filled with a liquid, such as water or an organic solvent, thus taking advantage of the fact that the wavelength of the exposure light in a liquid is 1/n that of in air (where n is the refractive index of the liquid, normally about 1.2 to 1.6), thereby improving the resolution as well as increasing the depth of focus by approximately n times.

As far as is permitted, the disclosure of the above PCT International Publication is hereby incorporated by reference.

Incidentally, when the projection optical system and the substrate move relatively to one another, the liquid in the immersion area between the projection optical system and the substrate surface begins to move while being dragged in the direction of the movement of the substrate. In particular, a phenomenon occurs wherein, if the relative movement occurs at high speed in order to improve throughput, then the liquid separates from the lower surface of the projection optical system. Consequently, the separation of the liquid from the lower surface of the projection optical system is prevented by increasing the flow rate of the liquid supplied to the immersion area Nevertheless, if the flow rate of the liquid is increased, then there is a problem in that the generation of vibrations and bubbles in accordance with the movement of the liquid hinders the formation of the circuit pattern.

SUMMARY OF THE INVENTION

The present invention was made considering the circumstances discussed above, and it is therefore an object of the present invention to provide an exposure apparatus, an exposure method, and a device fabrication method that can prevent a liquid, which is disposed between the lower surface of a projection optical system and the surface of a substrate, from separating from the lower surface of the projection optical system in accordance with relative movement of the projection optical system and the substrate.

The exposure apparatus, the exposure method, and the device fabrication method according to the present invention adopt the following means in order to solve the abovementioned problems.

The first aspect is an exposure apparatus that forms an immersion area by supplying a liquid onto a part of a substrate; and forms a prescribed pattern on the substrate through the liquid, wherein a spare immersion area, which is capable of holding part of the liquid on the substrate, is formed at an outer circumference of the immersion area.

In addition, the exposure apparatus may comprise a projection optical system, wherein the prescribed pattern is formed by exposing the substrate through the projection optical system and the liquid positioned between the projection optical system and the substrate; and when the projection optical system and the substrate move relatively to one another, part of the liquid of the immersion area can move to the spare immersion area, and part of the liquid of the spare immersion area also moves to the immersion area, in accordance with a direction of the relative movement.

In addition, the liquid of the spare immersion area may be held by a liquid holding part provided in a manner such that the liquid holding part is spaced apart by a prescribed distance from the outer circumference of the immersion area.

In addition, the liquid holding part may be provided at a outer circumference of a substantially annular groove part formed in a lower surface of the projection optical system.

The liquid holding part can comprise, for example, a substantially annular wall part.

In addition, the liquid holding part can also comprise a plurality of projection parts, which are disposed substantially annularly.

In addition, the liquid holding part is made of an elastic material.

In addition, a plurality of the liquid holding parts is provided.

In addition, a lyophilic area is formed in the liquid holding part.

In addition, a liquid recovery part, which recovers the liquid, is provided at an outer circumference of the liquid holding part.

In addition, the liquid recovery part, which recovers the liquid, is provided to a bottom surface of the groove part.

An exposure apparatus is provided, which exposes a substrate by filling a gap between the substrate and a projection optical system with a liquid, and projecting a pattern image onto the substrate through the projection optical system and the liquid, wherein:

an immersion area that includes a projection area of the projection optical system and that is continually filled with the liquid during an exposure operation, and a spare immersion area provided to an outer circumference of the immersion area are formed; and a first area wherein the liquid exists and a second area wherein the liquid does not exist are formed in the spare immersion area during the exposure operation, and the positions of the first area and the second area inside the spare immersion area change in accordance with the exposure operation.

The present invention also provides an exposure apparatus that exposes a substrate by forming an immersion area by supplying a liquid onto part of the substrate, and projecting a pattern image onto the substrate through the liquid, wherein the immersion area has a first area that includes an area wherein the pattern image is projected; and a second area, which is proximate to the first area, wherein the liquid is capable of moving to and from the first area.

The present invention further provides an exposure apparatus that exposes a substrate by forming an immersion area by supplying a liquid onto a part of the substrate, and projecting a pattern image onto the substrate through the liquid, the apparatus comprising: a liquid holding member for forming the immersion area, wherein the immersion area includes a first area, wherein the liquid is continually held during exposure, and a second area, which is capable of moving with respect to the liquid immersion holding member during the exposure.

The second aspect is an exposure method for exposing a substrate by forming an immersion area by supplying a liquid onto part of a substrate, which includes a projection area of a projection optical system, and projecting a pattern image onto the substrate through the projection optical system and the liquid positioned between the projection optical system and the substrate, the method comprising the step of disposing part of the liquid supplied onto the substrate in a spare immersion area that is formed at an outer circumference of the immersion area.

In addition, the step of disposing part of the liquid in the spare immersion area may be performed prior to exposure of the substrate.

In addition, there a further step may be provided, which supplies and recovers the liquid to and from the immersion area and the spare immersion area, wherein the amount of the liquid supplied to the immersion area and the spare immersion area is greater than the amount of the liquid recovered.

The third aspect is a device fabrication method that includes a lithographic process, wherein an exposure apparatus according to the first aspect, or an exposure method according to second aspect, is used in the lithographic process.

The present invention can achieve the following effects.

The first aspect is an exposure apparatus that forms an immersion area by supplying a liquid onto a part of a substrate, and forms a prescribed pattern on the substrate through the liquid, wherein a spare immersion area, which is capable of holding part of the liquid on the substrate, is formed at the outer circumference of the immersion area. Thereby, the spare immersion area that further holds the liquid at the outer circumference of the immersion area is formed; therefore, if, for example, the amount of the liquid in the immersion area has become insufficient, the liquid in the spare immersion area is supplied to the immersion area and it is therefore possible to avoid an exposure failure due to an insufficient amount of the liquid.

In addition, the exposure apparatus may have a projection optical system, wherein the prescribed pattern is formed by exposing the substrate through the projection optical system and the liquid positioned between the projection optical system and the substrate; and, when the projection optical system and the substrate move relatively to one another, part of the liquid of the immersion area moves to the spare immersion area, and vice versa, in accordance with the direction of the relative movement; therefore, even if the liquid of the immersion area begins to move from the lower surface of the projection optical system in accordance with the relative movement of the projection optical system and the substrate, the liquid of the spare immersion area is supplied to the lower surface of the projection optical system, and it is therefore possible to continually fill the area of the lower surface of the projection optical system with the liquid, without performing a special process.

In addition, the liquid of the spare immersion area is held by a liquid holding part, which is provided at the outer circumference of the immersion area, spaced apart by a prescribed distance; therefore, because the spare immersion area can be reliably formed at the outer circumference of the immersion area by a simple mechanism, it is possible to suppress an increase in the cost of the apparatus.

In addition, the liquid holding part is provided at the outer circumference of a substantially annular groove part formed in the lower surface of the projection optical system; therefore, it is possible, with a simple structure, to physically isolate the two areas that hold the liquid, i.e., the lower surface of the projection optical system and the liquid holding part; further, the immersion area and the spare immersion area can be easily formed.

In addition, the liquid holding part has a substantially annular wall part, and therefore can hold the liquid at the outer circumference of the immersion area with a simple structure.

In addition, the liquid holding part has a plurality of projection parts, which are disposed substantially annularly, and can therefore hold the liquid at the outer circumference of the immersion area with a simple structure.

In addition, the liquid holding part is made of an elastic material, and it is therefore possible to minimize damage to the substrate, and the like, when interference occurs between the liquid holding part and the substrate, and the like.

In addition, a plurality of the liquid holding parts is provided, and therefore the liquid can be held more reliably, leakage of the liquid to the outer side of the spare immersion area can be prevented, and problems with the exposure apparatus can be prevented.

In addition, a lyophilic area is formed in the liquid holding part, which makes it easier to form a bond with the molecules of the liquid, thereby strengthening the adhesion to the liquid and increasing the liquid holding power. Thereby, leakage of the liquid to the outer side of the spare immersion area can be prevented, and problems with the exposure apparatus can be prevented.

In addition, a liquid recovery part, which recovers the liquid, is provided at the outer circumference of the liquid holding part, and therefore the liquid that leaks to the outer side of the spare immersion area can be recovered, and problems with the exposure apparatus can be prevented.

In addition, the liquid recovery part, which recovers the liquid, is provided to the bottom surface of the groove part, and therefore it is easier to recover the liquid of the immersion area and the spare immersion area, leakage of the liquid to the outer side of the spare immersion area can be prevented, and problems with the exposure apparatus can be prevented.

In addition, an exposure apparatus that exposes a substrate by filling a gap between the substrate and a projection optical system with a liquid, and projecting a pattern image onto the substrate through the projection optical system and the liquid, has: an immersion area that includes a projection area of the projection optical system and that is continually filled with the liquid during the exposure operation; and a spare immersion area that is provided to the outer circumference of the immersion area; wherein, a first area wherein the liquid exists and a second area wherein the liquid does not exist are formed in the spare immersion area during the exposure, and the positions of the first area and the second area inside the spare immersion area change in accordance with the exposure operation. Thereby, if the position of the liquid of the spare immersion area formed at the outer circumference of the immersion area is changed in accordance with the movement of the substrate, then the liquid of the spare immersion area can be supplied to the immersion area if, for example, the amount of the liquid of the immersion area has become insufficient; on the other hand, the immersion area can be continually filled with the liquid by recovering the liquid that leaks out from the immersion area.

The second aspect is an exposure method that exposes a substrate by forming an immersion area by supplying a liquid onto part of a substrate that includes a projection area of a projection optical system, and projecting a pattern image onto the substrate through the projection optical system and the liquid positioned between the projection optical system and the substrate, comprising a step of disposing part of the liquid supplied onto the substrate in a spare immersion area that is formed at the outer circumference of the immersion area. Thereby, when the amount of the liquid in the immersion area has become insufficient, the liquid of the spare immersion area is supplied to the immersion area, and therefore it is possible to avoid an exposure failure because of an insufficient amount of the liquid, and to improve yield.

In addition, the process of disposing part of the liquid in the spare immersion area is performed prior to the exposure of the substrate, and therefore it is possible to avoid an exposure failure because of an insufficient amount of the liquid from the start of the exposure process, and to improve yield.

In addition, a process is included that supplies and recovers the liquid to and from the immersion area and the spare immersion area, wherein the amount of the liquid supplied to the immersion area and the spare immersion area is greater than the amount of liquid recovered; therefore, although part of the liquid overflows out of the immersion area, it is held by the spare immersion area, and it is therefore possible to avoid problems with the exposure apparatus due to the leakage of the liquid. Accordingly, there is no longer a need to precisely control the amount of the liquid in the immersion area so that it is constant, which simplifies control of the flow rate.

The third aspect is a device fabrication method that includes a lithographic process, wherein an exposure apparatus according to the first aspect, or an exposure method according to second aspect, is used in the lithographic process. Thereby, exposure failures are suppressed and yield can be improved. Accordingly, the fabrication cost of devices can be reduced.

DETAILED DESCRIPTION OF THE INVENTION

The following explains the embodiments of an exposure apparatus, an exposure method, and a device fabrication method according to the present invention, referencing the drawings.

Figure 1:
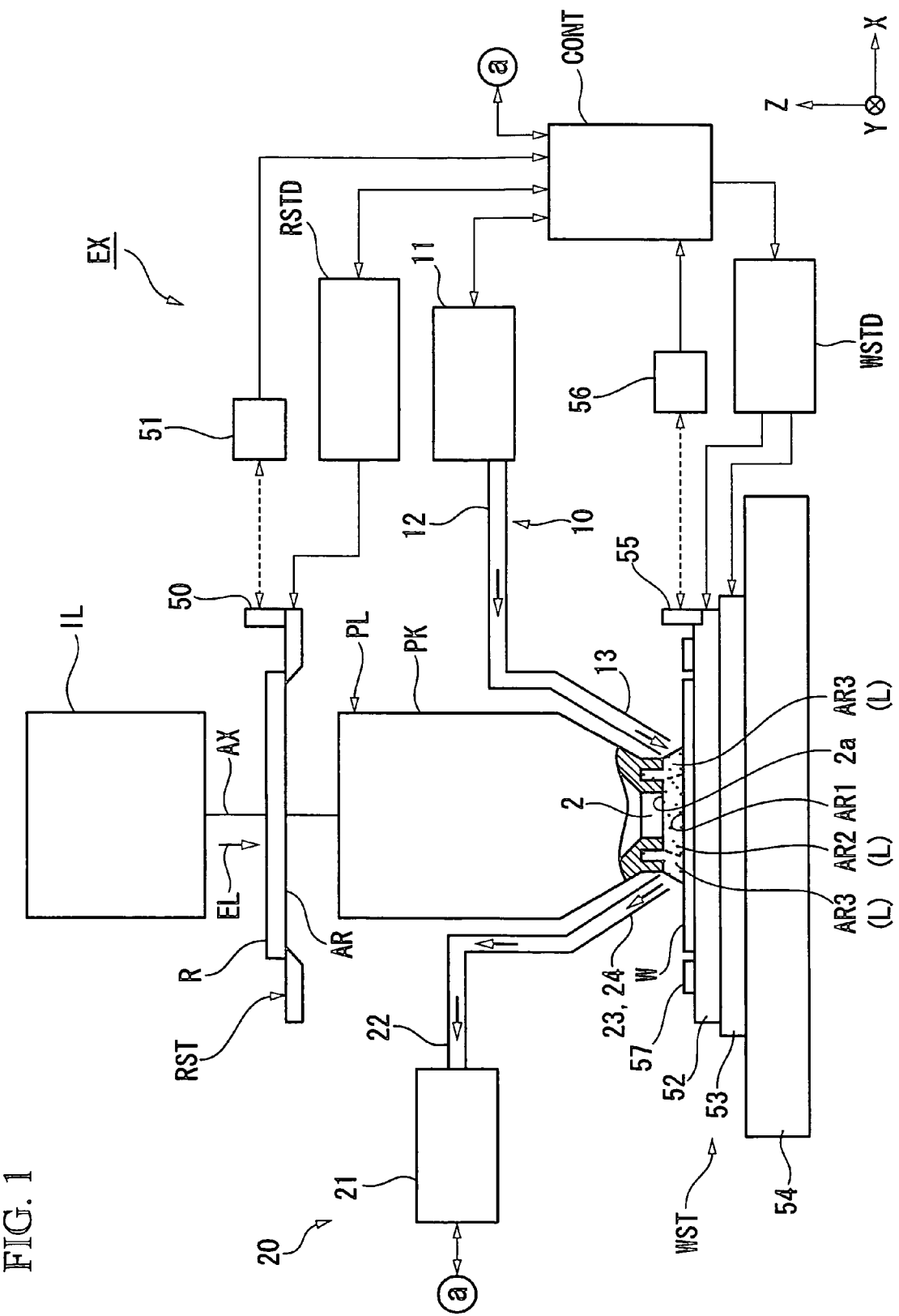
FIG. 1 is a schematic block diagram that depicts an exposure apparatus according to the present invention.

FIG. 1 is a schematic block diagram that depicts one embodiment of the exposure apparatus according to the present invention. In FIG. 1, an exposure apparatus EX has: a reticle stage RST that supports a reticle (mask) R in which a device pattern is formed; a wafer stage WST that supports a wafer (substrate) W coated with a photoresist, which is a photosensitive material; an illumination optical system IL that illuminates the reticle R supported by the reticle stage RST with exposure light EL; a projection optical system PL that projects the image of a pattern AR of the reticle R, which is illuminated by the exposure light EL, onto the wafer W supported by the wafer stage WST, so as to expose the wafer W; and a control apparatus CONT that performs supervisory control of the operation of the entire exposure apparatus EX.

Here, the present embodiment explains, as an example, a case of using a scanning type exposure apparatus (a so-called scanning stepper) as the exposure apparatus EX to expose the wafer W with the pattern AR formed in the reticle R, while synchronously moving the reticle R and the wafer W in mutually different orientations (reverse directions) in their respective scanning directions. In addition, in the explanation below, the direction that coincides with the optical axis AX of the projection optical system PL is the Z axial direction, the (scanning) direction in which the reticle R and the wafer W synchronously move within the plane perpendicular to the Z axial direction is the X axial direction, and the direction perpendicular to the Z axial direction and the X axial direction (non-scanning direction) is the Y axial direction.

Furthermore, the directions around the X, Y and Z axes are the θX, θY and θZ directions, respectively.

In addition, the exposure apparatus EX is an immersion exposure apparatus that adopts the liquid immersion method in order to substantially shorten the exposure wavelength, improve resolution, as well as substantially increase the depth of focus, and has a liquid supply mechanism 10 that supplies a liquid L onto the wafer W, and a liquid recovery mechanism 20 that recovers the liquid L on the wafer W.

Furthermore, the exposure apparatus EX, at least while transferring the image of the pattern AR of the reticle R onto the wafer W, forms, with the liquid L supplied from the liquid supply mechanism 10, an immersion area AR2 and a spare immersion area AR3 on part of the wafer W that includes the projection area AR1 of the projection optical system PL. Specifically, the exposure apparatus EX forms the immersion area AR2 by filling a gap between the optical element 2 at the tip (lower end) part of the projection optical system PL and the surface of the wafer W with the liquid L. In addition, the exposure apparatus EX forms the spare immersion area AR3 by also providing the liquid L at the outer circumference of the optical element 2 at the tip part of the projection optical system PL. Furthermore, the exposure apparatus EX exposes the wafer W by projecting the image of the pattern AR of the reticle R onto the wafer W through the projection optical system PL and the liquid L of the immersion area AR2.

Furthermore, by supplying the liquid L from the liquid supply mechanism 10 to the immersion area AR2 and the spare immersion area AR3, as well as by recovering the liquid L by the liquid recovery mechanism 20 from the immersion area AR2 and the spare immersion area AR3, the liquid L of the immersion area AR2 and the spare immersion area AR3 continually circulates; further, the contamination of the liquid L is strictly prevented, the temperature of the liquid L is strictly controlled, etc.

In addition, pure water is used as the liquid L in the present embodiment. Pure water can transmit the deep ultraviolet light (DUV light) such as KrF excimer laser light (248 nm wavelength), and the bright lines (g line, h line, and i line) in the ultraviolet region emitted from, for example, a mercury lamp, as well as vacuum ultraviolet light (VUV light), such as ArF excimer laser light (193 nm wavelength).

The illumination optical system IL illuminates the reticle R, which is supported by the reticle stage RST, with the exposure light EL and has: an exposure light source; an optical integrator that uniformizes the intensity or illuminance of the luminous flux emitted from the exposure light source; a condenser lens that condenses the exposure light EL from the optical integrator; a relay lens system; and a variable field stop that sets an illumination region on the reticle R illuminated by the exposure light EL to be slit shaped; and the like (none are shown). Further, the illumination optical system IL illuminates a predetermined illumination region on the reticle R with the exposure light EL, which has a uniform luminous flux intensity distribution.

Examples of light that can be used as the exposure light EL emitted from the illumination optical system IL include: deep ultraviolet light (DUV light) such as KrF excimer laser light (248 nm wavelength), the bright lines (g, h, and i lines) in the ultraviolet region emitted from, for example, a mercury lamp, and vacuum ultraviolet light (VUV light) such as ArF excimer laser light (193 nm wavelength) and $F_2$ laser light (157 nm wavelength). ArF excimer laser light is used in the present embodiment.

The reticle stage RST supports the reticle R, is two dimensionally movable in the plane perpendicular to the optical axis AX of the projection optical system PL, i.e., in the XY plane, and is finely rotatable in the θZ direction. A reticle stage drive apparatus RSTD (such as a linear motor), which is controlled by the control apparatus CONT, drives the reticle stage RST. A movable mirror 50 is provided on the reticle stage RST. In addition, a laser interferometer 51 is provided at a position opposing the movable mirror 50. Furthermore, the laser interferometer 51 measures in real time the position in the two dimensional directions and the rotational angle of the reticle R on the reticle stage RST, and outputs these measurement results to the control apparatus CONT. Furthermore, the control apparatus CONT drives the reticle stage drive apparatus RSTD based on the measurement results of the laser interferometer 51, and thereby positions the reticle R, which is supported by the reticle stage RST.

The projection optical system PL projects the pattern AR of the reticle R onto the wafer W at a prescribed projection magnification β so as to expose the wafer W, and has a plurality of optical elements that includes the optical element 2 provided at the tip part on the wafer W side; in addition, these optical elements are supported by a lens barrel PK. In the present embodiment, the projection optical system PL is a reduction system that has a projection magnification β of, for example, 1/4 or 1/5. Furthermore, the projection optical system PL may be an equal magnification system or an enlargement system. In addition, the optical element 2 at the tip part of the projection optical system PL is detachably (replaceably) provided to the lens barrel PK, and the liquid L of the immersion area AR2 contacts the optical element 2.

The optical element 2 is made of calcium fluorite. Because calcium fluorite has a strong affinity for water, the liquid L can adhere to substantially the entire surface of a liquid contact surface 2a of the optical element 2. Namely, because the liquid (water) L supplied has a strong affinity for the liquid contact surface 2a of the optical element 2, the liquid contact surface 2a of the optical element 2 and the liquid L have strong adhesion characteristics, and therefore the optical path between the optical element 2 and the wafer W can be reliably filled with the liquid L. Furthermore, the optical element 2 may be made of silica glass, which also has a strong affinity for water. In addition, the liquid contact surface 2a of the optical element 2 may be given hydrophilic (lyophilic) treatment in order to further raise its affinity for the liquid L.

In addition, the lower surface (hereinbelow, referred to as a liquid contact surface PKa) of the lens barrel PK, which surrounds and holds the optical element 2, is made of a material that is strongly lyophilic, e.g., anodized aluminum and the like, and has a strong affinity for the liquid L. Thereby, a gap between the wafer W and a lower surface PLa, which has the liquid contact surfaces 2a, PKa of the optical element 2 and the lens barrel PK respectively, of the projection optical system PL can be reliably filled with the liquid L.

In addition, an annular spare immersion area forming member 60 (not shown in FIG. 1) is fixed to a lower end part of the projection optical system PL so that it surrounds the lens barrel PK. Furthermore, the spare immersion area AR3 is formed by supplying the liquid L between the wafer W and a part of the lower surface of the spare immersion area forming member 60. Similar to the lens barrel PK, the spare immersion area forming member 60 is made of a material that is strongly lyophilic and has a strong affinity for the liquid L. Thereby, the liquid L provided between the wafer W and the spare immersion area forming member 60 is reliably held, which suppresses the leakage of liquid L to the outside of the spare immersion area forming member 60.

Furthermore, supply ports 13 of the liquid supply mechanism 10 and recovery ports 23 of the liquid recovery mechanism 20, these ports being discussed later, are formed in the spare immersion area forming member 60, and the liquid L of the immersion area AR2 and the spare immersion area AR3 is supplied and recovered through the supply ports 13 and the recovery ports 23.

Furthermore, the spare immersion area forming member 60 may be formed from a member different from the lens barrel PK, as described in the present embodiment, and may be fixed to the lower end part of the projection optical system PL, or it may be formed integrally with the lens barrel PK.

The wafer stage WST supports the wafer W and has a Z stage 52 that holds the wafer W via a wafer holder, an XY stage 53 that supports the Z stage 52, and a base 54 that supports the XY stage 53. A wafer stage drive part WSTD (such as a linear motor), which is controlled by the control apparatus CONT, drives the wafer stage WST. Furthermore, driving the Z stage 52 controls the position of the wafer W held on the Z stage 52 in the Z axial direction (the focus position) and in the θX and θY directions. In addition, driving the XY stage 53 controls the position of the wafer W in the X and Y directions (the position in the directions substantially parallel to the image plane of the projection optical system PL). In other words, the Z stage 52 controls the focus position and the inclination angle of the wafer W, and aligns the surface of the wafer W with the image plane of the projection optical system PL by an auto focus system and an auto leveling system; further, the XY stage 53 positions the wafer W in the X axial direction and Y axial direction. Furthermore, the Z stage 52 and the XY stage 53 may be integrally provided.

A movable mirror 55 is provided on the wafer stage WST (the Z stage 52). In addition, a laser interferometer 56 is provided at a position opposing the movable mirror 55. Furthermore, the laser interferometer 56 measures in real time the position in the two dimensional directions as well as the rotational angle of the wafer W on the wafer stage WST, and outputs these measurement results to the control apparatus CONT. Furthermore, the control apparatus CONT drives the wafer stage drive part WSTD based on the measurement results of the laser interferometer 56, and thereby positions the wafer W supported on the wafer stage WST.

In addition, an auxiliary plate 57 is provided on the wafer stage WST (Z stage 52) so that it surrounds the wafer W. The auxiliary plate 57 has a flat surface that is at a height substantially the same as the surface of the wafer W, which is held by the wafer holder. Furthermore, there is a gap of approximately 1 to 2 mm between the edge of the wafer W and the auxiliary plate 57, but hardly any of the liquid L flows into that gap due to the surface tension of the liquid L, and the auxiliary plate 57 can hold the liquid L at the lower surface PLa of the projection optical system PL, even when exposing the vicinity of the circumferential edge of the wafer W.

The liquid supply mechanism 10 supplies the prescribed liquid L onto the wafer W, and has a liquid producing part 11 that is capable of supplying the liquid L, the plurality of supply ports 13 disposed proximate to the surface of the wafer W, and a supply pipe 12 that connects the liquid producing part 11 to each of the supply ports 13. Furthermore, the plurality of supply ports 13 is formed in the spare immersion area forming member 60, which was discussed above. In addition, the liquid producing part 11 has an ultrapure water apparatus that produces pure water (liquid L), a tank that stores the liquid L, a pressure pump, and the like, and supplies the liquid L onto the wafer W through the supply pipe 12 and the supply ports 13.

Furthermore, among the various members that constitute the liquid supply mechanism 10, at least the member that distributes the liquid L is made of a synthetic resin, e.g., polytetrafluoroethylene. It is thereby possible to suppress the inclusion of impurities in the liquid L.

Furthermore, the liquid supply operation of the liquid producing part 11 is controlled by the control apparatus CONT, which can control the amount of the liquid supplied per unit of time to the wafer W by the liquid producing part 11.

The liquid recovery mechanism 20 recovers the liquid L on the wafer W, and has a liquid suction part 21 capable of suctioning the liquid L, a plurality of recovery ports 23 and recovery nozzles 24 disposed proximate to the surface of the wafer W, and a recovery pipe 22 that connects the liquid suction part 21 to each of the recovery ports 23 and recovery nozzles 24. (Although not shown in FIG. 1, the recovery ports 23 are also connected to the recovery pipe 22.) Furthermore, the plurality of recovery ports 23 is formed in the spare immersion area forming member 60, which is discussed above. In addition, the liquid suction part 21 has a suction apparatus, such as a vacuum pump, a tank that stores the recovered liquid L, or the like, and recovers the liquid L on the wafer W by suction through the recovery ports 23 and the recovery pipe 22.

Furthermore, similar to the liquid supply mechanism 10, in order to suppress the inclusion of impurities in the liquid L, among the various members that constitute the liquid recovery mechanism 20, at least the member that distributes the liquid L is made of a synthetic resin, e.g., polytetrafluoroethylene.

Furthermore, the liquid recovery operation of the liquid suction part 21 is controlled by the control apparatus CONT, which can control the amount of liquid recovered per unit of time by the liquid suction part 21.

Figure 2A:
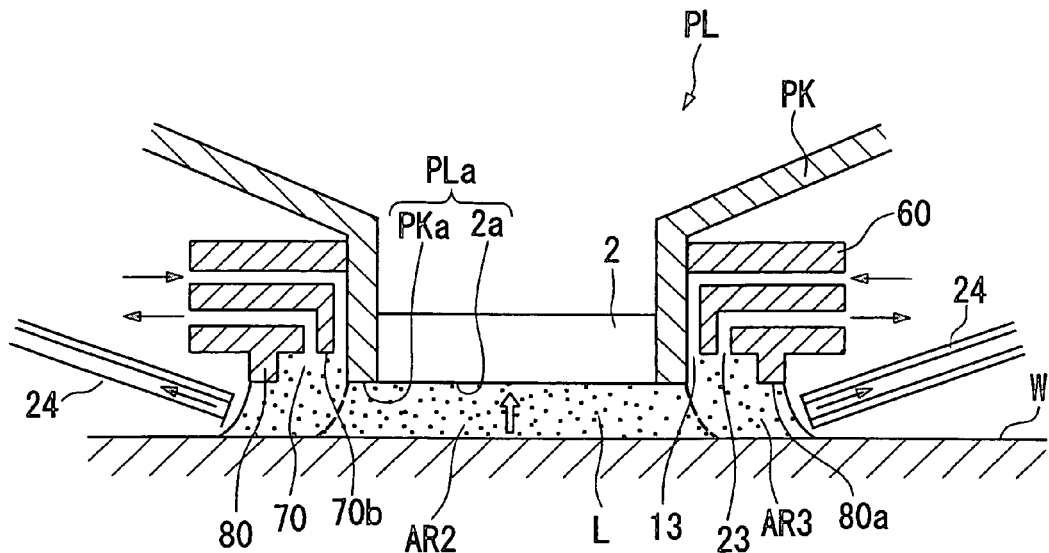
FIG. 2A is an enlarged view that depicts the vicinity of an immersion area, and is a side cross sectional view that includes a projection optical system PL.
Figure 2B:
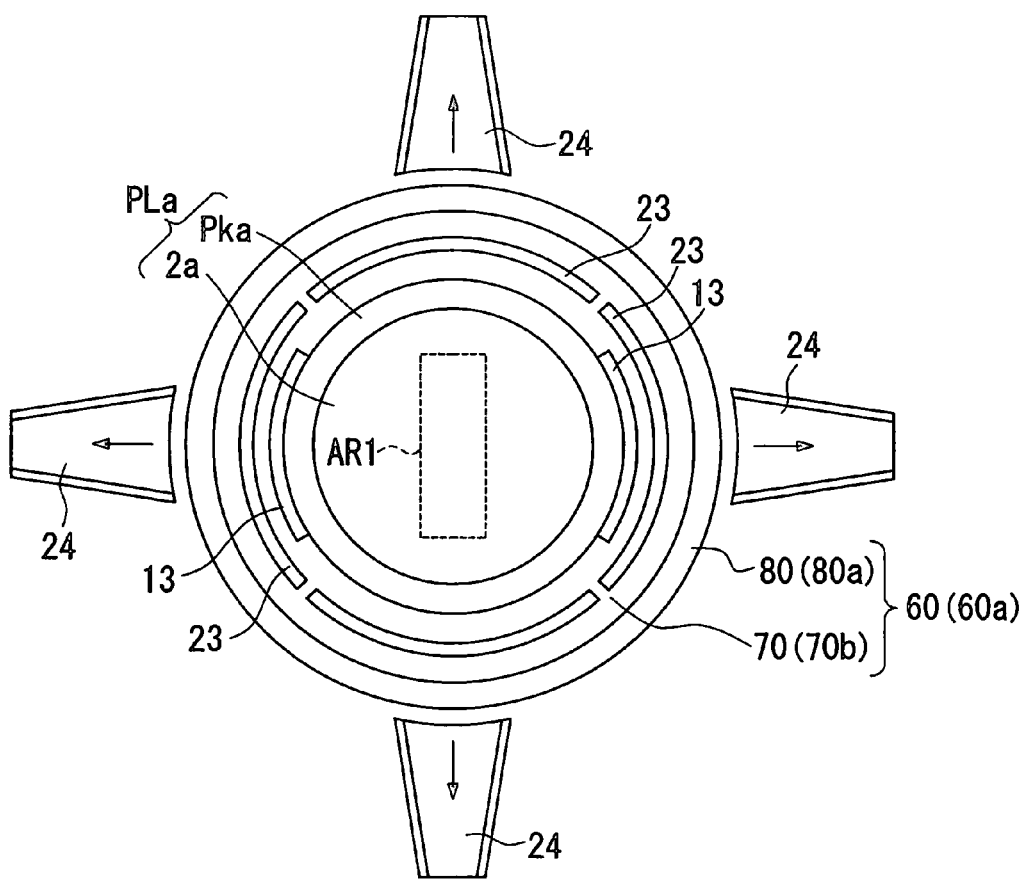
FIG. 2B depicts the lower surface side of the projection optical system PL, viewed from the wafer stage WST side.

FIGS. 2A and 2B are enlarged views that depict the details of the vicinity of the immersion area AR2, wherein FIG. 2A is a side cross sectional view that includes the projection optical system PL, and FIG. 2B depicts the lower surface side of the projection optical system PL, viewed from the wafer stage WST side. In addition, FIG. 3A is an perspective view of the lower surface side of the projection optical system PL, viewed from the wafer stage WST side.

Figure 3A:
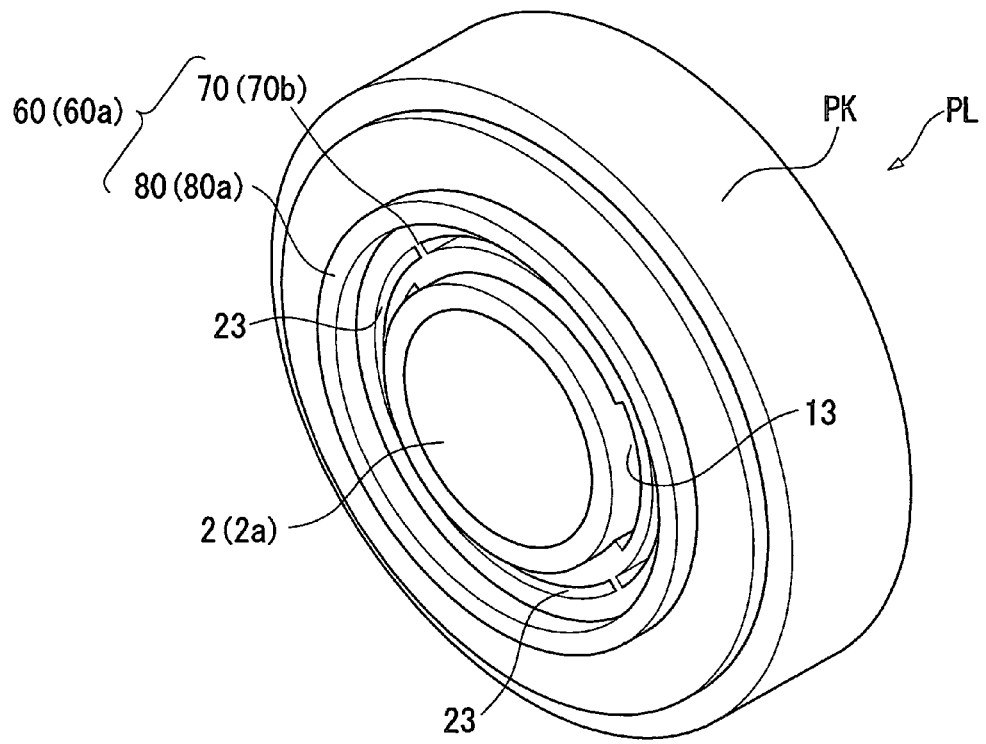
FIG. 3A is an perspective view of the lower surface side of the projection optical system, viewed from the wafer stage side.

As depicted in FIGS. 2A, 2B and 3A, the optical element 2 and part of the lens barrel PK that form the immersion area AR2 are disposed at the lower end part of the projection optical system PL.

In addition, the spare immersion area forming member 60 that forms the spare immersion area AR3 is disposed at the outer circumference of the lower end part of the .projection optical system PL. An annular groove part 70 and an annular wall part 80 (annular protrusion), which is disposed on the outer side of the groove part 70, are formed on the inner circumferential side of a lower surface 60a of the spare immersion area forming member 60.

The groove part 70 is formed so that it surrounds the lens barrel PK and sinks in the Z direction by a prescribed distance from the lower surface PLa of the projection optical system PL.

The wall part (liquid holding part) 80 is provided so that it is upright from a bottom surface 70b of the groove part 70 toward the wafer W, and so that it is spaced apart at a prescribed spacing in the radial direction from the lower surface PLa of the projection optical system PL that forms the immersion area AR2, and so that it surrounds the lower surface PLa of the projection optical system PL. Furthermore, the wall part 80 is formed so that the distance between the wafer W and the lower surface 80a of the wall part 80 is substantially identical to the distance between the wafer W and the lower surface PLa of the projection optical system PL. However, both distances may be different. For example, the distance between the wafer W and the lower surface 80a of the wall part 80 may be set smaller than the distance between the wafer W and the lower surface PLa of the projection optical system PL, and vice versa. Furthermore, it is preferable that the distance between the wafer W and the lower surface 80a of the wall part 80 is as small as possible. This is because the smaller the distance, the more reliably the liquid L is held by the surface tension thereof, and the better the leakage of the liquid to the outside can be prevented. Nevertheless, the smaller the distance between the wafer W and the lower surface 80a of the wall part 80, the greater the possibility of interfering with the wafer W and the like; therefore, as depicted in the present embodiment, the lower surface 80a of the wall part 80 may be formed so that it is at the substantially identical position (in the Z direction) as the lower surface PLa of the projection optical system PL, or the wall part 80 may be made of an elastic material, such as rubber. In addition, the area of the lower surface 80a of the wall part 80 is set in accordance with conditions, such as the amount of the liquid L held. For example, the larger the area of the lower surface 80a, the greater the surface area of contact with the liquid L, and the greater the amount of the liquid L that can be held. Furthermore, the lower surface 80a is not necessarily flat. For example, it may be hemispherical. This is because any shape is acceptable as long as the liquid L can be held by its surface tension.

In addition, it is also possible to increase or decrease the amount of the liquid L that can be held by adjusting the spacing between the immersion area AR2 and the wall part 80, i.e., by adjusting the width of the groove parts 70.

For example, depending on the amount of the liquid L to be held, the width of the lower surface 80a may be set five times or more greater than the distance between the lower surface 80a of the wall part 80 and the wafer W. In addition, the width of the groove part 70 may be set five times or more greater than the distance between the lower surface 80a of the wall part 80 and the wafer W. In this case, if the distance between the lower surface 80a of the wall part 80 and the wafer W is set to 1 to 2 mm, then the width of the lower surface 80a should be set to 5 to 10 mm or greater, and the width of the groove part 70 should be set to 5 to 10 mm or greater.

The supply ports 13, which are part of the liquid supply mechanism 10 that supply the liquid L onto the wafer W, and the recovery ports 23, which are part of the liquid recovery mechanism 20 that recovers the liquid L on the wafer W, are formed at the bottom surface 70b of the groove part 70.

Figure 3B:
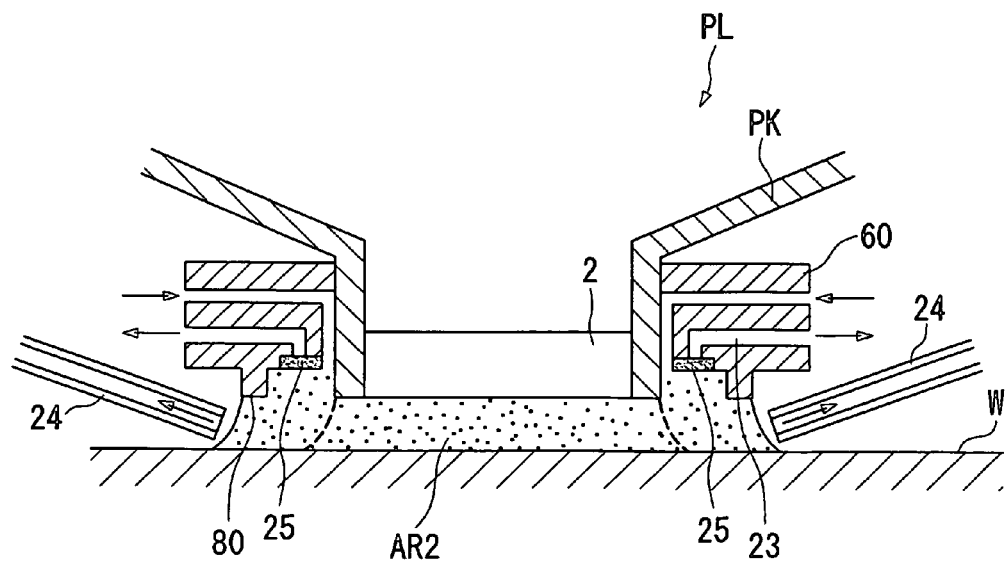
FIG. 3B is an enlarged view that depicts the vicinity of the immersion area according to a modified example, and is a side cross sectional view that includes the projection optical system PL.

As depicted in FIG. 2B and FIG. 3A, the supply ports 13 are at the bottom surface 70b of the groove part 70, and are formed as two arched slit holes along the outer circumference of the lens barrel PK of the projection optical system PL on both sides of the wafer W in the scanning directions (the +X direction and the −X direction). In addition, as depicted in FIG. 2B and FIG. 3A, the recovery ports 23 are at the bottom surface 70b of the groove part 70, and are formed as substantially annular slit holes at the outer circumference of the supply ports (liquid recovery parts) 13. The recovery ports 23 are formed substantially annular in order to recover, without any leakage, the liquid L on the wafer W. Furthermore, the bottom surface 70b of the groove part 70 wherein the recovery ports 23 are formed may be made of a porous body 25, as depicted in FIG. 3B. This is because, by recovering the liquid L through the porous body 25, it becomes difficult to suck gas (air) into the recovery pipe 22, and it is therefore possible to prevent the generation of vibrations in accordance with the intermixing of bubbles.

In addition, the porous body 25 may be formed around the entire circumference of the bottom surface 70b of the groove part 70, and the liquid L may be collected via the recovery ports 23 connected to this porous body 25. At this time, if the liquid L is sucked in at a fixed pressure by, for example, the liquid recovery mechanism 20 (not shown in FIG. 9A and FIG. 9B, but refer to FIG. 1), which is connected to the recovery ports 23, then it is possible to prevent the outflow of the liquid L outside of a predetermined area because the liquid L is continually collected at the portion where it contacts the porous body 25, even if the amount of the liquid L inside the spare immersion area AR3 fluctuates and the contact area between the porous body 25 and the liquid L varies. Furthermore, because the recovery of the liquid L is performed continually through the porous body 25, it becomes difficult for gas to be sucked into the recovery pipe 22, and it is therefore also possible to prevent the generation of vibrations in accordance with the intermixing of gas.

Furthermore, the plurality of recovery nozzles (liquid recovery parts) 24, which recover the liquid L, is also disposed at the outer circumference of the wall part 80. These recovery nozzles are for the purpose of recovering the liquid L that leaks to the outer circumference side of the wall part 80, and to prevent problems with the exposure apparatus EX. The shape, arrangement, quantity, and the like of the recovery nozzles 24 can be suitably modified in accordance with the amount of the liquid leakage and the like.

Furthermore, by supplying the liquid L from the supply ports 13 onto the wafer W, a gap between the wafer W and the lower surface PLa of the projection optical system PL, which constitutes the liquid contact surfaces 2a, PKa of the optical element 2 and the lens barrel PK respectively, is filled with the liquid L, thereby forming the immersion area AR2. Furthermore, the immersion area AR2 includes the projection area AR1 (see FIG. 2B) of the projection optical system PL, which is set to a rectangular shape wherein the longitudinal direction is the Y axial direction (the non-scanning direction). As discussed above, because the liquid contact surfaces 2a, PKa of the optical element 2 and the lens barrel PK are made of a material that has a strong affinity for the liquid L, they closely contact the liquid L and hold the liquid L by the surface tension thereof.

Furthermore, the liquid L supplied from the supply ports 13 onto the wafer W also flows into part of the area surrounded by the wall part 80, between the lower surface 60a of the spare immersion area forming member 60 and the wafer W, thereby filling this part with the liquid L and forming the spare immersion area AR3. Furthermore, it is not the case that the entire outer circumferential area of the immersion area AR2 is continually filled with the liquid, and the spare immersion area AR3 is formed by filling a part thereof with the liquid L (refer to FIG. 4).

Thus, because the groove part 70 is provided at the outer circumference of the immersion area AR2, and the wall part 80 is further provided to the outer side thereof spaced apart by a prescribed gap, the spare immersion area AR3, which further holds the liquid L, is formed at the outer circumference of the immersion area AR2.

Furthermore, the liquid L of the immersion area AR2 and the liquid L of the spare immersion area AR3 are in close contact, and the liquid L can alternate (be distributed) between the immersion area AR2 and the spare immersion area AR3. This is because, similar to the optical element 2 and the like, the wall part 80 and the groove part 70 are made of a material that has a strong affinity (lyophilic) for the liquid L, and therefore the liquid L of the immersion area AR2 and the liquid L of the spare immersion area AR3 form a state wherein they are in continuous communication, without being spaced apart.

In addition, the periphery of the spare immersion area AR3 (the side not in contact with the immersion area AR2) transitions to a state wherein it contacts the gas (e.g., an inert gas, such as air or nitrogen gas) inside the space in which the wafer stage WST, the projection optical system PL, and the like are installed.

The following explains the method of exposing the wafer W with the image of the pattern AR of the reticle R by using the exposure apparatus EX discussed above, referencing the drawings.

Figure 4:
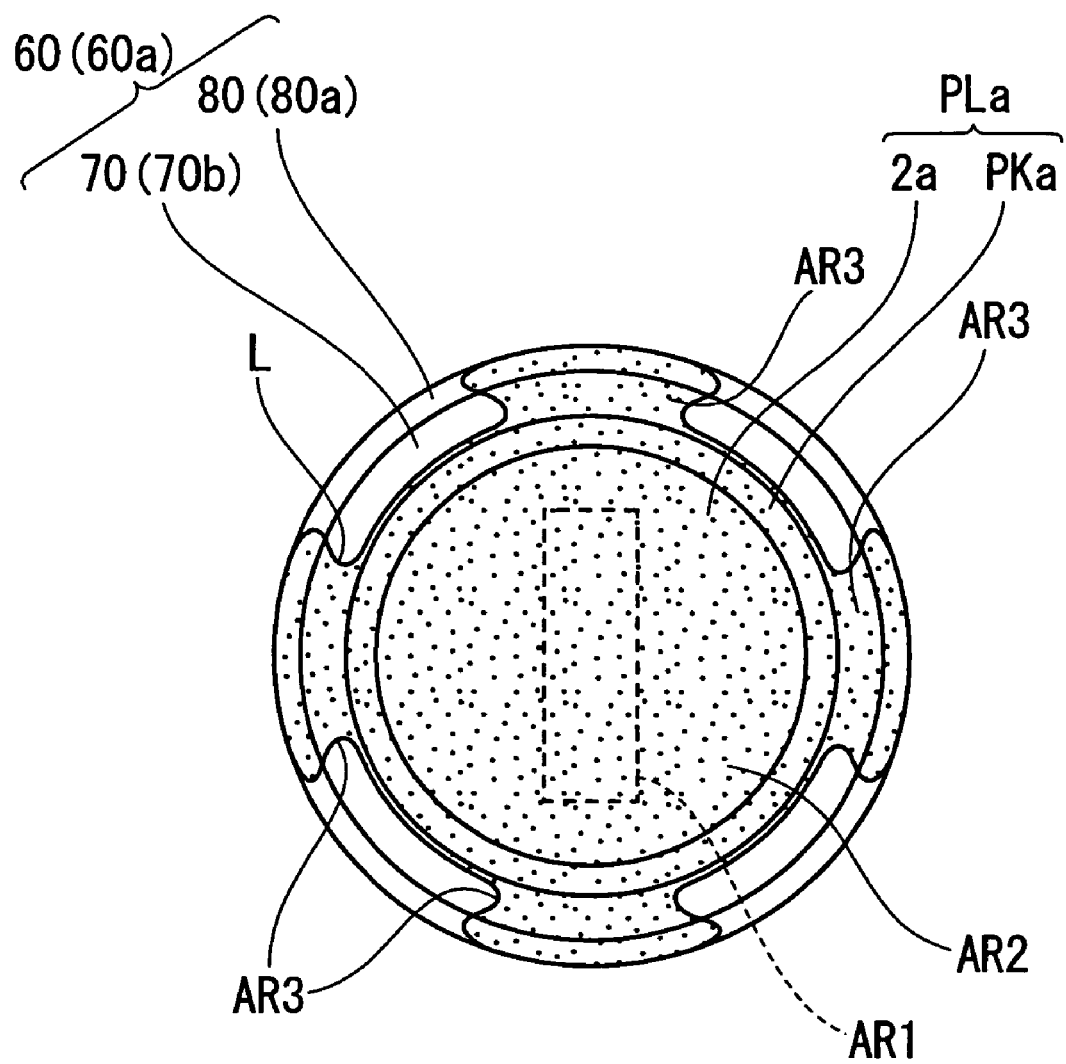
FIG. 4 depicts an example of the shape of the liquid disposed in the immersion area and the spare immersion area at the start of exposure.
Figure 5:
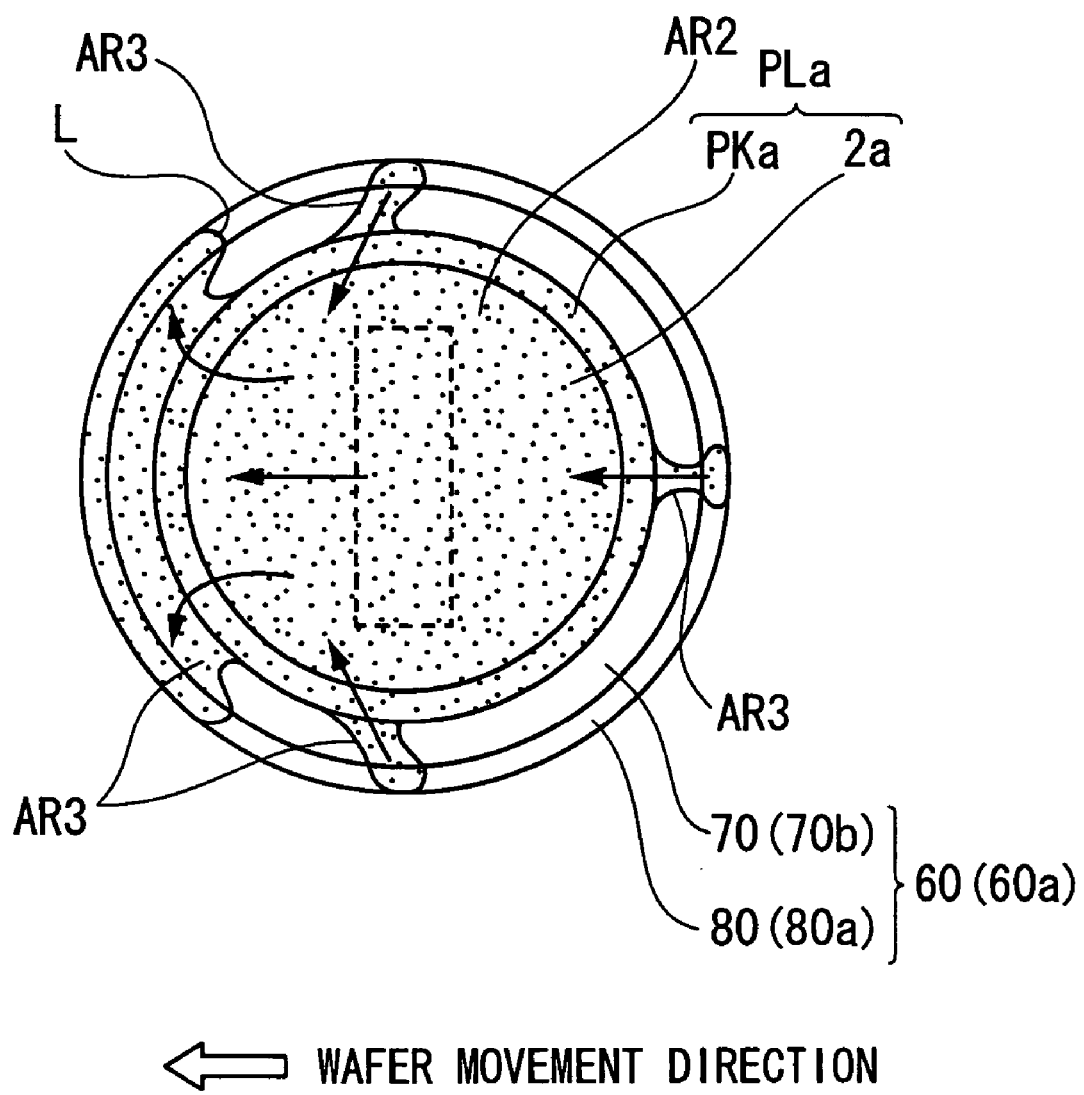
FIG. 5 depicts an aspect of the movement of the liquid in the immersion area and the spare immersion area.

FIG. 4 depicts an example of the shape of the liquid L disposed in the immersion area AR2 and the spare immersion area AR3 at the start of exposure. FIG. 5 depicts an aspect of the movement of the liquid L in the immersion area AR2 and the spare immersion area AR3.

First, when the reticle R is loaded on the reticle stage RST, the wafer W is loaded on the wafer stage WST, and the scanning exposure process is started, the control apparatus CONT operates the liquid supply mechanism 10 and starts the operation of supplying the liquid onto the wafer W. When the liquid supply mechanism 10 is operated, the liquid L supplied from the liquid producing part 11 is distributed through the supply pipe 12, and then is simultaneously supplied onto the wafer W from the supply ports 13 formed on both sides of the bottom surface 70b of the groove part 70 of the spare immersion area forming member 60, in the scanning direction. The liquid L supplied onto the wafer W flows along the surface of the lens barrel PK and fills the area of the lower surface PLa of the projection optical system PL, thereby forming the immersion area AR2. Furthermore, after the immersion area AR2 is formed, the liquid L is continuously supplied and, as depicted in FIG. 4, fills part of the outer circumferential area of the immersion area AR2, thereby forming the spare immersion area AR3.

Furthermore, after forming the immersion area AR2 and the spare immersion area AR3, the liquid recovery mechanism 20 is also operated, the amount of the liquid L supplied and the amount of the liquid L recovered are set substantially equal, or so that the supplied amount is slightly greater than the recovered amount, and that state is maintained.

In so doing, the liquid L of, for example, an amount equal to at least approximately 10 to 20% of the liquid L in the immersion area AR2 is disposed in the spare immersion area AR3 at the start of the exposure.

Next, after the various exposure conditions are set, prescribed preparatory work, such as the reticle alignment using a reticle microscope, an off-axis alignment sensor, and the like (none are shown), the baseline measurement of an alignment sensor, and the like are performed under the management of the control apparatus CONT. Subsequently, when the fine alignment (enhanced global alignment (EGA) and the like) of the wafer W using the alignment sensor is finished, the array coordinates of a plurality of shot regions on the wafer W is derived.

When the preparatory work for exposing the wafer W is finished, the control apparatus CONT continues to monitor the measurement values of the laser interferometer 56 on the wafer W side based on the alignment result, and instructs the wafer stage drive part WSTD to move the wafer stage WST to an acceleration start position (scan start position) in order to expose a first shot region of the wafer W.

Subsequently, the control apparatus CONT instructs the reticle stage drive part RSTD and the wafer stage drive part WSTD to start scanning with the reticle stage RST and the wafer stage WST in the X axial direction; when the reticle stage RST and the wafer stage WST reach their respective target scanning speeds, the exposure light EL irradiates the pattern area of the reticle R, thereby starting the scanning exposure.

Furthermore, the different areas of the pattern area of the reticle R are consecutively illuminated by the exposure light EL, and the scanning exposure of the first shot region on the wafer W is finished by the completion of the illumination of the entire surface of the pattern area. Thereby, the pattern AR of the reticle R is reduction-transferred onto the resist layer of the first shot region on the wafer W through the projection optical system PL and the liquid L.

When the scanning exposure of this first shot region is finished, the control apparatus CONT moves the wafer stage WST in steps in the X and Y axial directions, and moves it to the acceleration start position in order to expose a second shot region. Namely, a stepping operation is performed between the shots.

Furthermore, the second shot region is scanning-exposed, as discussed above.

In so doing, the scanning exposure of a shot region on the wafer W and the stepping operation in order to expose the next shot region are performed repetitively, and the pattern AR of the reticle R is thereby sequentially transferred onto all exposure target shot regions on the wafer W.

After the completion of the wafer W exposure process, the operation of the liquid supply mechanism 10 is stopped, the amount of the liquid L recovered by the liquid recovery mechanism 20 is increased, and all of the liquid L in the immersion area AR2 and the spare immersion area AR3 is recovered.

Furthermore, after recovering the liquid L, the wafer W is replaced and the exposure process is resumed for the new wafer W. By the repetition of such a process, a plurality of wafers W is exposed.

As discussed above, when performing a scanning exposure, the exposure apparatus EX moves the wafer W, via the XY stage 53, with respect to the projection optical system PL, in the +X direction (or the −X direction) at a speed ($\beta \cdot V$) (where $\beta$ is the projection magnification), synchronized to the movement of the reticle R in the −X direction (or +X direction) at a speed V. Furthermore, the scanning exposure and the subsequent stepping operation in order to expose the next shot region are performed repetitively. Namely, by using the so-called step-and-scan system, the scanning exposure process is performed sequentially for each shot region while moving the wafer W.

Thus, when the wafer W is moved in the X and Y directions with respect to the projection optical system PL, the lower surface PLa of the projection optical system PL, i.e., the liquid L disposed in the immersion area AR2, is dragged by the movement of the wafer W and begins to move in the movement direction thereof. . In particular, the wafer W moves at a high speed (e.g., approximately 300 mm/s) during the scanning exposure, and the amount of movement of the liquid L therefore becomes large.

With a conventional exposure apparatus, if the liquid L moves together with the wafer W, then the liquid L separates at part of the lower surface PLa of the projection optical system PL (on the side opposite to the movement direction of the wafer W), which changes the wavelength of the exposure light EL and creates a risk of an exposure failure.

Nevertheless, in the exposure apparatus EX of the present embodiment, a spare immersion area AR3 is further provided at the outer circumference of the immersion area AR2; consequently, as depicted in FIG. 5, if the wafer W moves, then the liquid L of the immersion area AR2 flows into the spare immersion area AR3 in the movement direction of the wafer W. Simultaneously therewith, the liquid L in the spare immersion area AR3 on the side opposite to the movement direction of the wafer W flows into the immersion area AR2.

Namely, the spare immersion area AR3 functions like a spare tank for the immersion area AR2 by collecting the liquid L that overflows from the immersion area AR2 in accordance with the movement of the wafer W, as well as by supplying the liquid L to the immersion area AR2. Thereby, a shortage of the liquid L in the immersion area AR2 can be replenished, and the immersion area AR2 can be continually filled with the liquid L. Furthermore, because the entire area where the spare immersion area AR3 is formed, i.e., the area surrounded by the wall part 80, is not completely filled with the liquid L, the liquid L recovered from the immersion area AR2 to the spare immersion area AR3 can be accumulated inside the area surrounded by the wall part 80 without leaking to the outer side thereof.

Furthermore, when the movement direction of the wafer W reverses and the like, the wafer W moves so that the liquid L collected in the spare immersion area AR3 returns to the immersion area AR2, while the liquid L in the immersion area AR2 returns to the spare immersion area AR3. In addition, even when the wafer W moves on back and forth in the non-scanning direction, or when the movement in the scanning direction and the movement in the non-scanning direction are performed repetitively, the liquid L likewise goes back and forth between the immersion area AR2 and the spare immersion area AR3, and the immersion area AR2 can thereby be continually filled with the liquid L.

Thus, by further providing the spare immersion area AR3 at the outer circumference of the immersion area AR2, it is possible to easily and reliably avoid a shortage of the liquid L in the immersion area AR2 in accordance with the movement of the wafer W, and the immersion area AR2 can be continually filled with the liquid L. In addition, even if the movement direction of the wafer W changes, the liquid L disposed in the immersion area AR2 and the spare immersion area AR3 goes back and forth therebetween, and it is therefore possible to continually fill the area of the lower surface PLa of the projection optical system PL with the liquid L, as well as to maintain a constant wavelength of the exposure light EL. It is thereby possible to prevent an exposure failure.

Accordingly, it is no longer necessary, as with a conventional exposure apparatus, to perform a special process, such as controlling, independently for each supply port, the flow rate of the liquid L supplied from the plurality of supply ports in accordance with the movement direction, the speed, and the like of the wafer W, and it is thereby possible to reduce the burden on the control apparatus CONT and to reduce the equipment cost of the exposure apparatus EX.

Incidentally, the amount of the liquid L disposed in the immersion area AR2 and the spare immersion area AR3 during the exposure process does not always need to be constant. In other words, the amount of the liquid L supplied from the liquid supply mechanism 10 may be identical to the amount of the liquid L recovered from the liquid recovery mechanism 20, or the amount supplied may be greater than the amount recovered. For example, the liquid L disposed in the spare immersion area AR3 at the start of exposure may be an amount equal to approximately 10 to 20% of the amount of the liquid L in the immersion area AR2, the amount of the liquid L supplied to the spare immersion area AR3 during the exposure process may increase gradually, and, at the completion of the wafer W exposure process, the spare immersion area AR3 may be completely filled with the liquid L.

Thus, if the amount of the liquid L supplied can be made greater than the amount recovered, there is no longer a need to precisely control the amount supplied and the amount recovered so that they are substantially constant in order to prevent leakage from the immersion area AR2 or a shortage of liquid therein, as is the case with a conventional exposure apparatus, which reduces the burden on the control apparatus CONT.

Accordingly, while ensuring that the amount of the liquid L supplied in the exposure apparatus EX does not fall below the amount recovered, minimum flow rate control should be performed so that the increase in the temperature of the liquid L in accordance with the exposure process is within a prescribed range, which can simplify the control (operation) of the exposure apparatus EX.

In addition, if the wafer W is damaged or the like, bubbles may be generated in the liquid L when such is supplied onto that wafer W. Furthermore, when these bubbles reach the immersion area AR2 in accordance with the movement of the wafer W, there is a possibility that they may affect the exposure. Nevertheless, according to the present embodiment, if the bubbles are positioned on the outer side of the spare immersion area AR3, then, even if the bubbles generated on the wafer W move toward the immersion area AR2 in accordance with the movement of the wafer W, the bubbles can be captured by the spare immersion area AR3, which is positioned before the immersion area AR2. Consequently, it is possible to prevent the infiltration of the bubbles into the immersion area AR2 and to avoid influence on the exposure.

As explained above, the lower surface PLa of the projection optical system PL can be continually filled with the liquid L. Furthermore, because the liquid L is pure water, it can be easily obtained in large quantities at semiconductor fabrication plants and the like, and has an advantage in that it does not adversely affect the photoresist on the wafer W, the optical elements (lenses), and the like. In addition, pure water does not adversely affect the environment and has an extremely low impurity content, and can therefore be expected to also serve the function of cleaning the front surface of the wafer W as well as the lower surface PLa of the projection optical system PL.

Further, because the refractive index n of (pure) water for the exposure light EL that has a wavelength of approximately 193 nm is substantially 1.47, the use of ArF excimer laser light (193 nm wavelength) as the light source of the exposure light EL would shorten the wavelength on the wafer W to 1/n, i.e., to approximately 131 nm, thereby obtaining a high resolution. Furthermore, because the depth of focus will increase approximately n times, i.e., approximately 1.47 times, that of in air, the numerical aperture of the projection optical system PL can be further increased if it is preferable to ensure a depth of focus approximately the same as that when used in air, and the resolution is also improved from this standpoint.

Furthermore, the operating procedure described in the embodiment discussed above, as well as the shapes and combinations of the constituent members and the like, are just examples, and it is understood that variations and modifications are possible based on process conditions, design requirements, and the like, without departing from the spirit and scope of the present invention. The present invention includes, for example, the following types of modifications.

Figure 6:
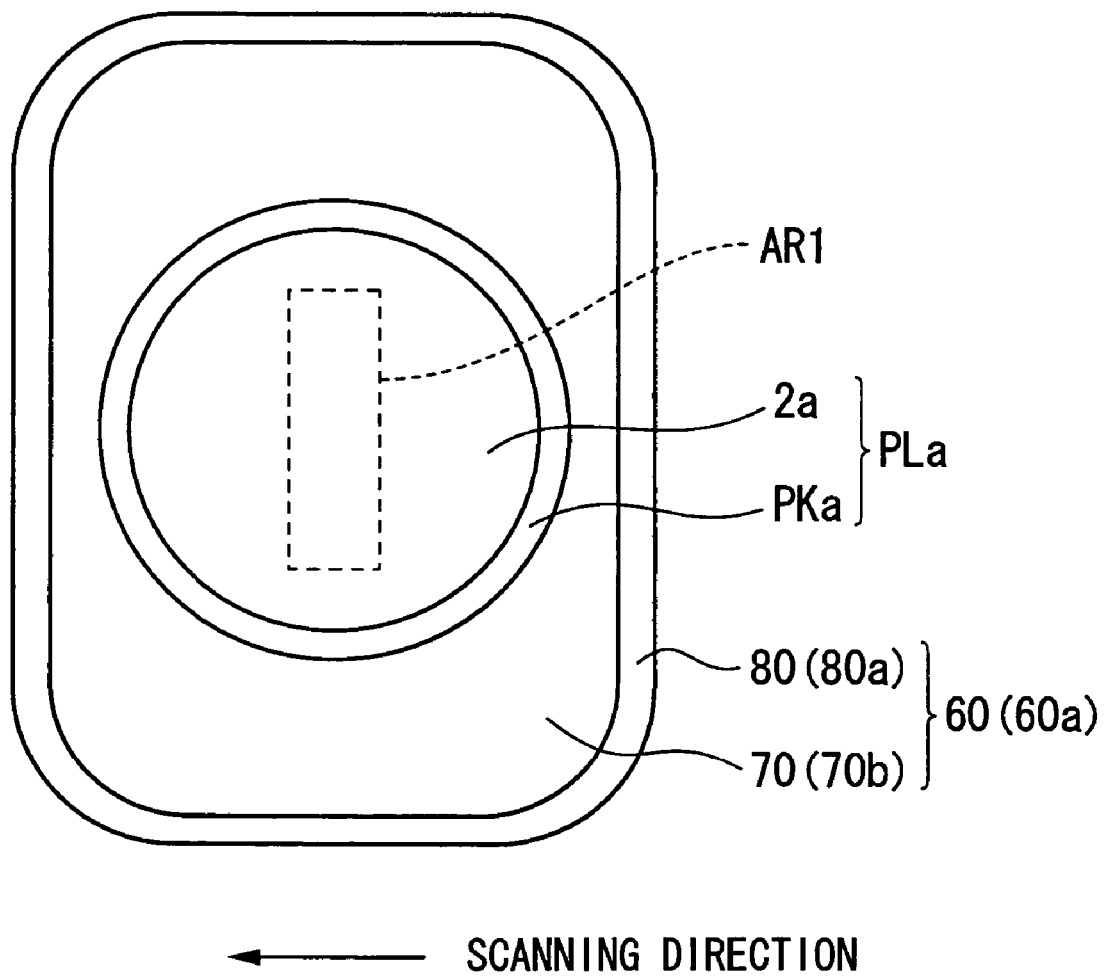
FIG. 6 depicts a modified example of a groove part.
Figure 7A:
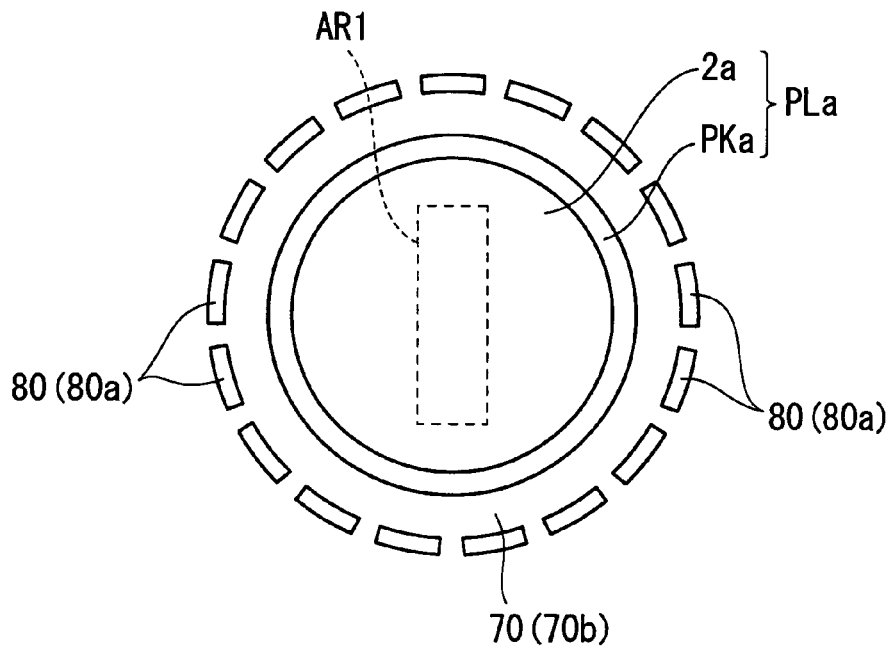
FIG. 7A depicts a modified example of wall parts.
Figure 7B:
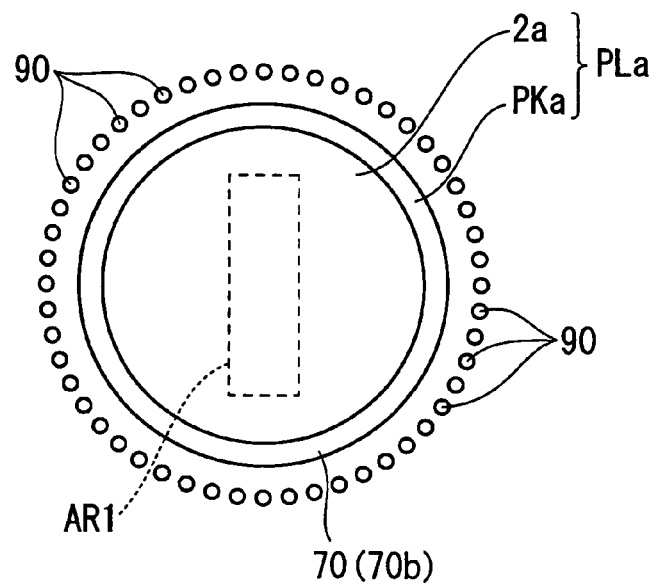
FIG. 7B depicts another modified example of wall parts.
Figure 8A:
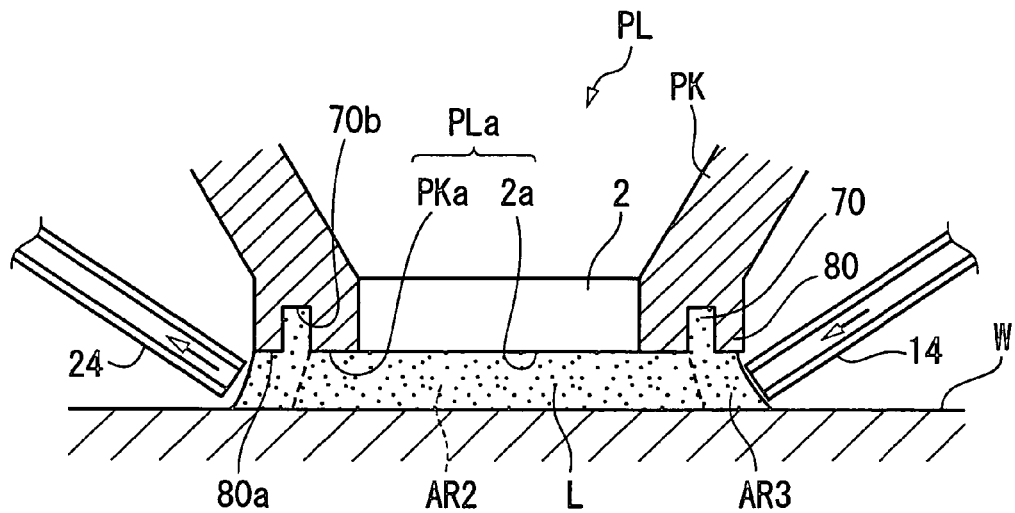
FIG. 8A depicts an example wherein a liquid recovery mechanism, which recovers the liquid at the bottom surface of the groove part, is provided, and is a side cross sectional view that includes the projection optical system PL.
Figure 8B:
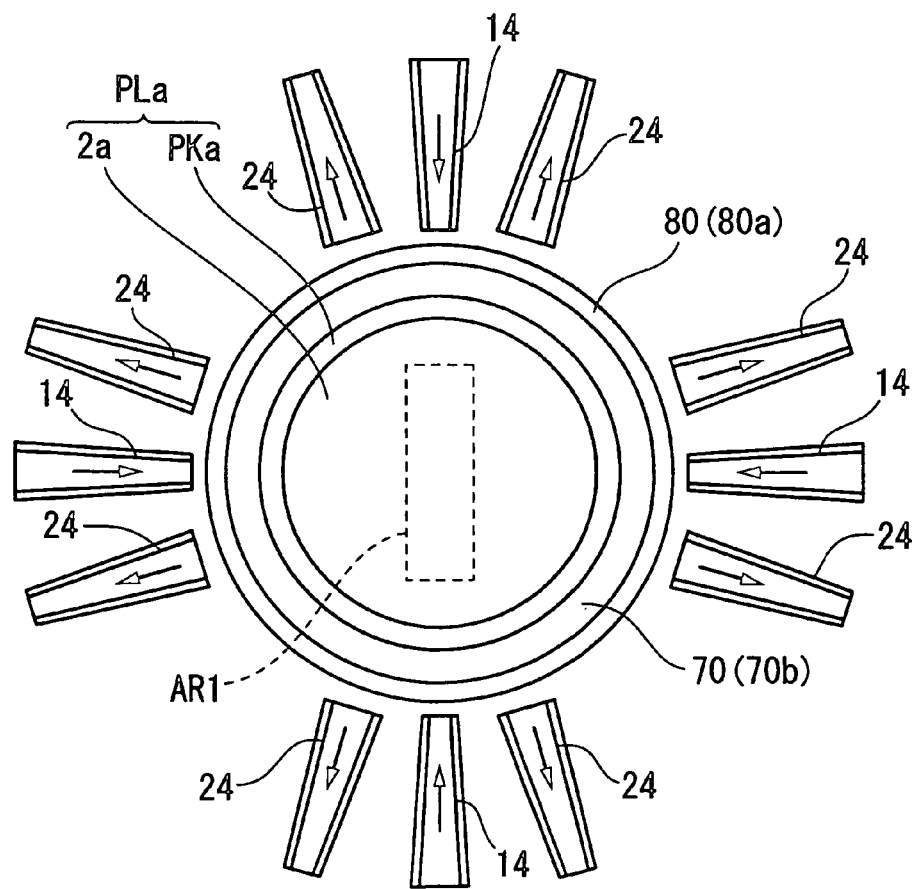
FIG. 8B depicts the lower surface side of the projection optical system PL in the same example, viewed from the wafer stage WST side.
Figure 9A:
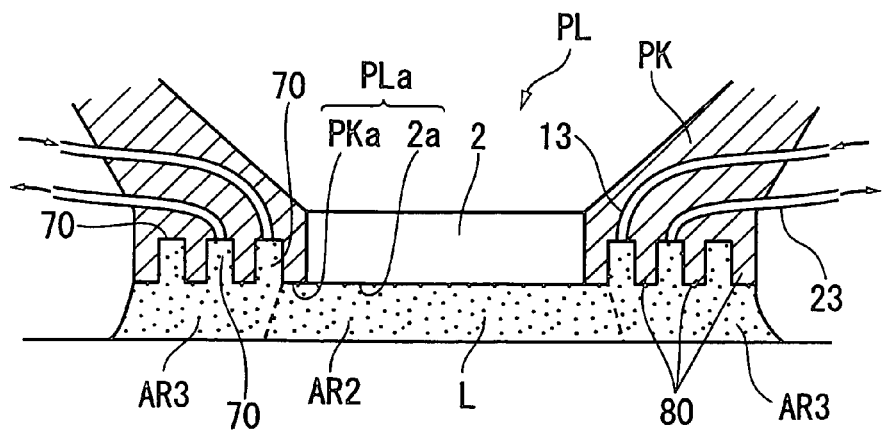
FIG. 9A depicts an example wherein a plurality of wall parts and the like, which form the spare immersion area, is provided, and is a side cross sectional view that includes the projection optical system PL.
Figure 9B:
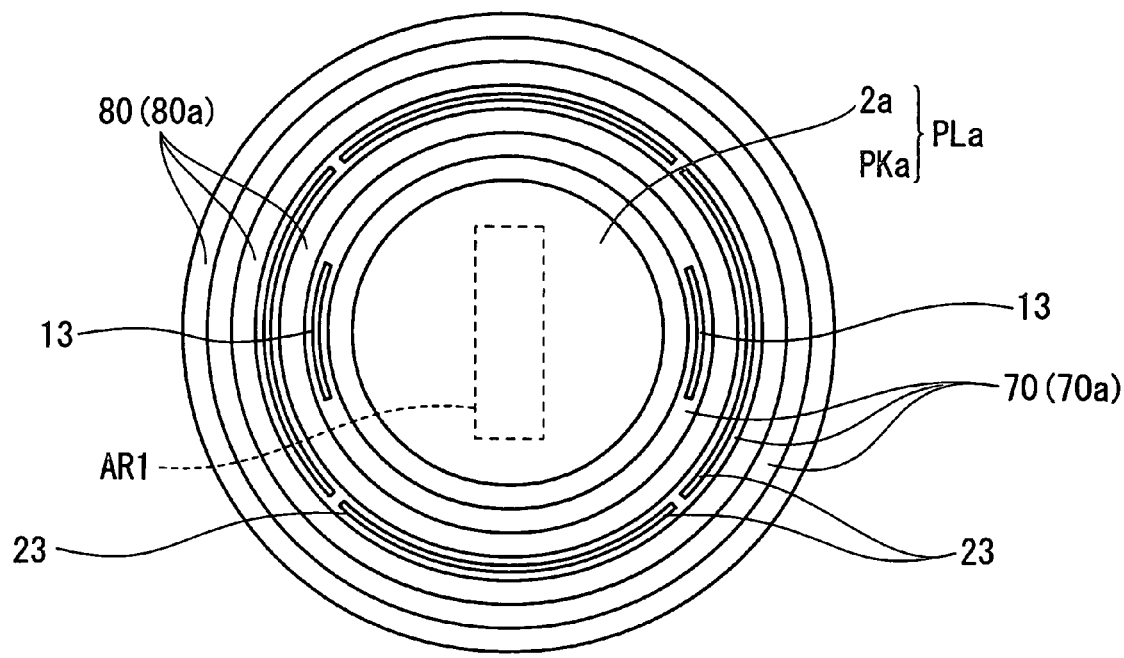
FIG. 9B depicts the lower surface side of the projection optical system PL in the same example, viewed from the wafer stage WST side.

Furthermore, FIG. 6 depicts a modified example of the groove part 70; FIGS. 7A and 7B depict modified examples of the wall part 80; FIGS. 8A and 8B depict an example wherein supply nozzles 14 are disposed at the outer circumference of the wall part 80; and FIGS. 9A and 9B depict an example wherein a plurality of wall parts 80 and the like is provided, which forms the spare immersion area AR3.

The amount of the liquid L disposed in the spare immersion area AR3 (the holding amount) is preferably adjusted by the speed of the movement of the wafer W. This is because the higher the movement speed of the wafer W, the greater the amount of the liquid L that moves between the immersion area AR2 and the spare immersion area AR3, which requires that a large amount of the liquid L be held by the spare immersion area AR3.

For example, if the movement speed of the wafer W in the non-scanning direction is greater than the movement speed in the scanning direction, then the width of the groove part 70 in the non-scanning direction may be set greater than the width in the scanning direction, as depicted in FIG. 6.

In addition, the present embodiment explained a case wherein the wall part 80 has a shape that is annularly closed, but the present invention is not limited thereto. As depicted in FIG. 7A, gaps may be formed in the wall part 80. This is because there will be no problem with leakage of the liquid L as long as the gaps are of a size such that the liquid L is held by its surface tension. Thus, if gaps are formed in the wall part 80, the recovery nozzles 24 may be disposed in those gaps.

In addition, in place of a substantially annular wall part 80, a plurality of projection parts (liquid holding parts) 90, which are substantially annularly disposed, may be formed as depicted in FIG. 7B. This is because the liquid L can be held by its surface tension as long as the spacing between each of the projection parts. 90 is sufficiently narrow.

In addition, the present embodiment explained a case wherein the supply ports 13 of the liquid supply mechanism 10, as well as the recovery ports 23 of the liquid recovery mechanism 20, are provided to the bottom surface 70b of the groove part 70, but the supply nozzles 14 and the recovery nozzles 24 may be disposed at the outer circumference of the wall part 80, as depicted in FIGS. 8A and 8B.

In addition, although not shown, the supply ports 13 and the recovery ports 23 may be provided to the lower surface 80a of the wall part 80.

In addition, a plurality of groove parts 70 and wall parts 80 that form the spare immersion area AR3 may be provided. This is because further providing a plurality of wall parts 80 and the like, which hold the liquid L, at the outer circumference of one wall part 80, as depicted in FIGS. 9A and 9B, can increase the power of the spare immersion area AR3 to hold the liquid L, and can prevent the leakage of the liquid to the outer side of the spare immersion area AR3.

In this case, setting a large width (increasing the surface area) of the lower surfaces 80a of the wall parts 80, which are each disposed between mutually adjacent groove parts 70, is useful for holding the liquid L of the immersion area AR2.

At this time, there is no need to set the width of each lower surface 80a of the plurality of wall parts 80 so that they are equal; for example, the width of the lower surface of the inner side wall part may be set larger, or vice versa.

Furthermore, there is no need to form the wall surface of each wall part 80 so that it is perpendicular to the front surface of the wafer W, and each wall surface may be a surface that is inclined so that it intersects the front surface of the wafer W.

Furthermore, as depicted in FIGS. 9A and 9B, the supply ports 13 that supply the liquid L may be provided to the bottom surface 70b of the innermost side groove part 70, while the recovery ports 23 that recover the liquid L may be provided to the bottom surface 70b of the second groove part 70. Thus, the arrangement, quantity, and the like of the supply ports 13 and the recovery ports 23 can be suitably modified.

In the embodiments discussed above, a lens is affixed as the optical element 2 at the tip of the projection optical system PL, and the optical characteristics of the projection optical system PL, e.g., aberrations (spherical aberration, coma aberration, and the like), can be adjusted by this lens, but the optical element 2 can also be a plane parallel plate that is lower in cost than the lens.

Using a plane parallel plate as the optical element 2 is advantageous because, even if a substance (e.g., a silicon based organic substance and the like), which lowers the uniformity of the transmittance of the projection optical system PL, and the illumination intensity and the illumination intensity distribution of the exposure light EL on the wafer W during the transport, assembly, and adjustment of the exposure apparatus EX, adheres to that plane parallel plate, only the plane parallel plate needs to be replaced immediately before supplying the liquid L, and that replacement cost is lower compared with using a lens as the optical element that contacts the liquid L. In other words, because the surface of the optical element that contacts the liquid L becomes contaminated due to the adhesion of scattered particles generated from the resist because of the irradiation using the exposure light EL, and due to impurities in the liquid L, and the like, that optical element must be periodically replaced; however, by using a low cost plane parallel plate for this optical element, the cost of the replacement part is lower than a lens, less time is needed to effect the replacement, and it is possible to suppress any increase in the maintenance cost (running cost) or decrease in throughput.

In addition, if high pressure is generated by the flow of the liquid L between the wafer W and the optical element 2 at the tip of the projection optical system PL, then instead of making the optical element 2 replaceable, the optical element 2 may be firmly fixed by that pressure so that it does not move.

In addition, although the embodiments discussed above explained a case wherein water is used as the liquid L, it may be a liquid other than water; for example, if the light source of the exposure light EL is an $F_2$ laser, then the $F_2$ laser light is not transmitted through water, so it would be acceptable to use as the liquid L a fluorine based fluid, such as fluorine based oil, that is capable of transmitting $F_2$ laser light. In this case, the portion that contacts the liquid L is preferably given lyophilic treatment by, for example, forming a thin film with a substance that has a low polarity molecular structure and contains fluorine.

In addition, it is also possible to use as the liquid L one (e.g., cedar oil) that is transparent to the exposure light EL, has the highest possible refractive index, and is stable with respect to the projection optical system PL and the photoresist provided on the surface of the wafer W. In this case as well, the surface is treated according to the polarity of the liquid L used.

Furthermore, in the embodiments discussed above, an exposure apparatus is adopted that locally fills the liquid in the opening between the projection optical system PL and the substrate P, but the present invention can also be adapted to a liquid immersion exposure apparatus that moves a stage, which holds the substrate to be exposed, in a liquid bath, as well as to a liquid immersion exposure apparatus that forms a liquid bath that has a prescribed depth on the stage and holds the substrate therein. The structure and exposure operation of the immersion exposure apparatus that moves the stage that holds the substrate to be exposed in the liquid bath is disclosed in, for example, Japanese Published Unexamined Patent Application No. H06-124873, and the immersion exposure apparatus that forms a liquid bath of a prescribed depth on the stage and holds the substrate therein is disclosed in, for example, Japanese Published Unexamined Patent Application No. H10-303114 and U.S. Pat. No. 5,825,043. As far as is permitted, the disclosures of the abovementioned publications and the U.S. Patent are each hereby incorporated by reference.

In addition, the present invention can also be adapted to an exposure apparatus that has an exposure stage that can hold and move a substrate, such as a wafer, to be processed, and a measurement stage, which is equipped with various measuring members, sensors, and the like, as disclosed in Japanese Published Unexamined Patent Application No. 11-135400. As far as is permitted, the disclosure of the abovementioned publication is hereby incorporated by reference.

In addition, the exposure apparatus, wherein the liquid immersion method discussed above is applied, is constituted to fill the space of the optical path on the emission side of the terminal optical member of the projection optical system PL with a liquid (pure water), and then expose the wafer W (the substrate P), but the exposure apparatus may be constituted so that it also fills the space of the optical path on the incident side of the terminal optical member of the projection optical system with a liquid (pure water), as disclosed in the pamphlet of International Publication WO2004/019128. As far as is permitted, the disclosure of the above cited pamphlet is hereby incorporated by reference.

Furthermore, the numerical aperture NA of the projection optical system may become 0.9 to 1.3 if the liquid immersion method as discussed above is used. If the numerical aperture NA of such a projection optical system increases, then random polarized light conventionally used as the exposure light may degrade imaging performance due to the polarization effect, and it is therefore preferable to use polarized illumination. In that case, it is better to illuminate with linearly polarized light aligned in the longitudinal direction of the line pattern of the line-and-space pattern of the mask (the reticle), and to emit a large amount of diffracted light of the S polarized light component (the TE polarized light component), i.e., the polarized light directional component aligned in the longitudinal direction of the line pattern, from the pattern of the mask (the reticle). If the opening between the projection optical system PL and the resist deposited on the surface of the substrate P is filled with a liquid, then the transmittance through the resist surface increases for the diffracted light of the S polarized light component (the TE polarized light component), which contributes to the improvement of the contrast, compared with the case in which the opening between the projection optical system PL and the resist deposited on the surface of the substrate P is filled with air (i.e., a gas), and a high imaging performance can consequently be obtained even if the numerical aperture NA of the projection optical system exceeds 1.0. In addition, it is more effective to appropriately combine a phase shift mask, the oblique incidence illumination method (particularly, the dipole illumination method) aligned in the longitudinal direction of the line pattern as disclosed in Japanese Published Unexamined Patent Application No. H06-188169, and the like. As far as is permitted, the disclosure of the abovementioned publication is hereby incorporated by reference.

In addition, if the substrate P is exposed with a fine line-and-space pattern (e.g., a line-and-space of approximately 25 to 50 nm) using, for example, an ArF excimer laser as the exposure light, as well as using a projection optical system PL that has a reduction magnification of approximately 1/4, then the structure of a mask M (e.g., the fineness of the pattern and the thickness of the chrome) causes the mask M to act as a polarizing plate due to the wave guide effect, and a larger amount of diffracted light of the S polarized light component (the TE polarized light component) in comparison with the diffracted light of the P polarized light component (the TM polarized light component), which decreases contrast, is emitted from the mask. In this case as well, it is preferable to use the linear polarized light illumination as discussed above; however, even if the mask M is illuminated with random polarized light, a high resolution performance can be obtained by using a projection optical system with a large numerical aperture NA of 0.9 to 1.3. In addition, if exposing a substrate P with an ultrafine line-and-space pattern of a mask M, then there is also a possibility that the P polarized light component (the TM polarized light component) will become greater than the S polarized light component (the TE polarized light component) due to the wire grid effect; however, if conditions are such that the substrate P is exposed with a line-and-space pattern larger than 25 nm, for example, an ArF excimer laser as the exposure light, as well as using a projection optical system that has a reduction magnification of approximately 1/4, then a greater quantity of diffracted light of the S polarized light component (the TE polarized light component) than the diffracted light of the P polarized light component (the TM polarized light component) is emitted from the mask, and therefore a high imaging performance can be obtained even in the case of a projection optical system with a large numerical aperture NA of 0.9 to 1.3.

Furthermore, instead of just linear polarized light illumination (S polarized light illumination) aligned in the longitudinal direction of the line pattern of the mask (the reticle), it is also effective to combine the oblique incidence illumination method with the polarized light illumination method that linearly polarizes light in a direction tangential (circumferential) to a circle with the optical axis at the center. In particular, if the mask (reticle) pattern mixes line patterns extending in a plurality of differing directions, instead of a line pattern extending in a prescribed single direction, then by combining the zonal illumination method with the polarized light illumination method that linearly polarizes light in a direction tangential to a circle having the optical axis at its center, it is possible to achieve high imaging performance even if the numerical aperture NA of the projection optical system is large.

In addition, the wafer W is not limited to a semiconductor wafer for fabricating semiconductor devices, and is also applicable to a glass substrate for a display device, a ceramic wafer for a thin film magnetic head, and the like.

In addition to a step-and-scan system scanning type exposure apparatus (scanning stepper) for performing scanning and exposure using the pattern of the reticle by synchronously moving the reticle and the wafer, the exposure apparatus EX can also be adapted to a step-and-repeat system projection exposure apparatus (stepper) for performing exposure for the full pattern of the reticle with the reticle and the wafer in a stationary state and sequentially steps the wafer. In addition, the present invention can also be adapted to a step-and-stitch system exposure apparatus that partially and superimposedly transfers at least two patterns onto the wafer.

In addition, the present invention can also be adapted to the twin stage type exposure apparatus disclosed in Japanese Published Unexamined Patent Application No. H10-163099 and the corresponding U.S. Pat. No. 6,341,007, Japanese Published Unexamined Patent Application No. H10-214783 and the corresponding U.S. Pat. No. 6,341,007, Published Japanese Translation No. 2000-505958 of the PCT International Publication and the corresponding U.S. Pat. No. 5,969,441, and the like. Furthermore, as far as is permitted, the disclosures of the abovementioned publications are each hereby incorporated by reference.

The type of exposure apparatus EX is not limited to semiconductor device fabrication exposure apparatuses that expose a wafer with the pattern of a semiconductor device, but can also be widely adapted to exposure apparatuses for fabricating liquid crystal devices or displays, exposure apparatuses for fabricating thin film magnetic heads, imaging devices (CCDs), or reticles and masks, and the like.

In addition, if a linear motor is used in the wafer stage or the reticle stage, then either an air levitation type that uses an air bearing, or a magnetic levitation type that uses Lorentz's force or reactance force, may be used. In addition, the stages may be a type that moves along a guide, or may be a guideless type. Furthermore, if a planar motor is used as the drive apparatus for a stage, then either the magnet unit (permanent magnet) or the armature unit should be connected to the stage, and the other should be provided to the moving surface side (base) of the stage.

The reaction force generated by the movement of the wafer stage may be mechanically discharged to the floor (ground) using a frame member of the type recited in Japanese Published Unexamined Patent Application No. H08-166475 and the corresponding U.S. Pat. No. 5,528,118, so that the movement is not transmitted to the projection optical system PL. As far as is permitted, the disclosure of the abovementioned U.S. patent is hereby incorporated by reference.

The reaction force generated by the movement of the reticle stage may be mechanically discharged to the floor (ground) using a frame member of the type recited in Japanese Published Unexamined Patent Application No. H08-330224 and the corresponding U.S. Pat. No. 5,874,820, so that the movement is not transmitted to the projection optical system PL. As far as is permitted, the disclosure of the abovementioned U.S. Patent is hereby incorporated by reference.

An exposure apparatus to which the present invention is adapted is manufactured by assembling various subsystems, including each constituent element recited in the claims of the present application, so that a prescribed mechanical accuracy, electrical accuracy, and optical accuracy are maintained. To ensure these various accuracies, adjustments are performed before and after this assembly, including an adjustment to achieve optical accuracy for the various optical systems, an adjustment to achieve mechanical accuracy for the various mechanical systems, and an adjustment to achieve electrical accuracy for the various electrical systems. The process of assembling the exposure apparatus from the various subsystems includes the mutual mechanical connection of the various subsystems, the wiring and connection of electrical circuits, the piping and connection of the atmospheric pressure circuit, and the like. Naturally, before the process of assembling the exposure apparatus from the various subsystems, there is also the process of assembling each individual subsystem. When the process of assembling the exposure apparatus from the various subsystems is finished, a comprehensive adjustment is performed to ensure the various accuracies of the exposure apparatus as a whole. Furthermore, it is preferable to manufacture the exposure apparatus in a clean room wherein the temperature, the cleanliness level, and the like, are controlled.

Figure 10:
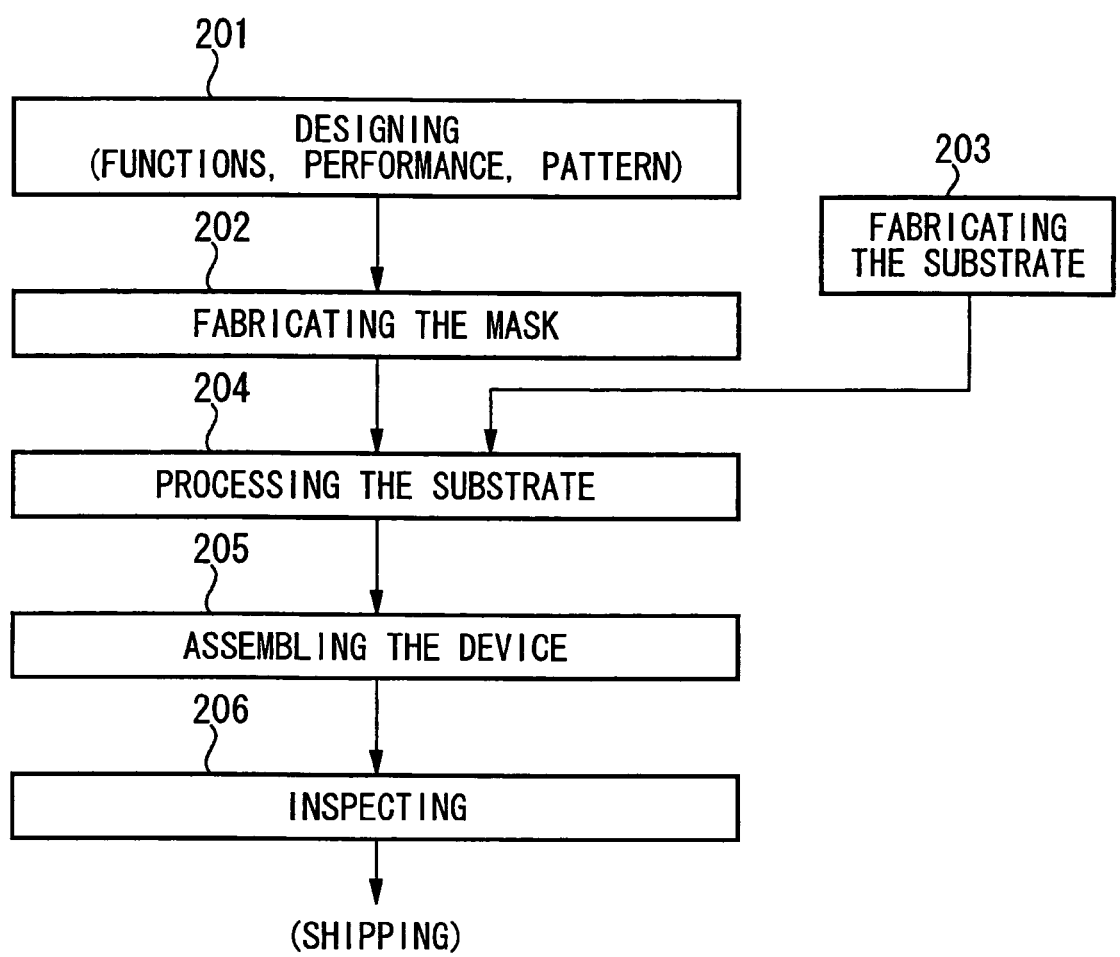
FIG. 10 is a flow chart diagram that depicts one example of a process for manufacturing a semiconductor device.

In addition, as shown in FIG. 10, a micro-device, such as a semiconductor device, is manufactured by: a step 201 that designs the functions and performance of the micro-device; a step 202 that fabricates a mask (reticle) based on this design step; a step 203 that fabricates a substrate, which is the base material of the device; an exposure processing step 204 wherein the exposure apparatus EX of the embodiments discussed above exposes the substrate with a pattern of the mask; a device assembling step 205 (including a dicing process, a bonding process, and a packaging process); an inspecting step 206; and the like.

What is claimed is:

1. An exposure apparatus that forms an immersion area by supplying a liquid onto a part of a substrate, and forms a prescribed pattern on the substrate through the liquid, wherein the exposure apparatus includes a liquid holding part that defines a spare immersion area, which holds a part of the liquid on the substrate and that is formed at an outer circumference of the immersion area, an upper surface of the substrate defining a lower boundary of the spare immersion area.

2. An exposure apparatus according to claim 1, further comprising a projection optical system, wherein:
the prescribed pattern is formed by exposing the substrate through the projection optical system and the liquid positioned between the projection optical system and the substrate; and
when the projection optical system and the substrate move relative to one another, part of the liquid of the immersion area moves to the spare immersion area, and part of the liquid of the spare immersion area also moves to the immersion area, in accordance with a direction of the relative movement.

3. An exposure apparatus according to claim 1, wherein the liquid holding part is spaced apart by a prescribed distance from the outer circumference of the immersion area.

4. An exposure apparatus according to claim 3, wherein the liquid holding part is provided at an outer circumference of a substantially annular groove part formed in a lower surface of a projection optical system.

5. An exposure apparatus according to claim 3, wherein the liquid holding part has a substantially annular wall part.

6. An exposure apparatus according to claim 3, wherein the liquid holding part has a plurality of projection parts, which are disposed substantially annularly.

7. An exposure apparatus according to claim 3, wherein the liquid holding part is made of rubber.

8. An exposure apparatus according to claim 3, wherein a plurality of the liquid holding parts is provided.

9. An exposure apparatus according to claim 3, wherein a lyophilic area is formed on a downwardly extending wall of the liquid holding part.

10. An exposure apparatus according to claim 2, wherein a liquid recovery part, which recovers the liquid, is provided at an outer circumference of the liquid holding part.

11. An exposure apparatus according to claim 4, wherein a liquid recovery part, which recovers the liquid, is provided to a bottom surface of the annular groove part.

12. An exposure apparatus that exposes a substrate by filling a gap between the substrate and a projection optical system with a liquid, and projecting a pattern image onto the substrate through the projection optical system and the liquid, wherein:
    an immersion area that includes a projection area of the projection optical system and that is continually filled with the liquid during an exposure operation, and a spare immersion area, being defined by a liquid holding part, provided to an outer circumference of the immersion area are formed; and
    a control unit controls the exposure operation such that a first area wherein the liquid exists and a second area wherein the liquid does not exist are formed in the spare immersion area during the exposure operation, and positions of the first area and the second area inside the spare immersion area change in accordance with the exposure operation,
    wherein an upper surface of the substrate defines a lower boundary of the first area and the second area of the spare immersion area.

13. An exposure apparatus that exposes a substrate by forming an immersion area by supplying a liquid onto part of the substrate, and projecting a pattern image onto the substrate through the liquid, wherein the immersion area is defined by a liquid holding member and has a first area that includes an area wherein the pattern image is projected; and a second area, which is proximate to the first area, wherein the liquid is capable of moving to and from the first area, an upper surface of the substrate defining a lower boundary of the first area and the second area, wherein the liquid holding member includes:
    a first liquid holding part that specifies a boundary between the first area and the second area; and
    a second liquid holding part that specifies the second area on a side where the second liquid holding part does not contact the first area.

14. An exposure apparatus according to claim 13, wherein the second area is configured to surround the first area; and an amount of the liquid held by the second area changes in accordance with a direction in which the substrate moves during the exposure.

15. An exposure apparatus according to claim 13, wherein at least one of the first liquid holding part and the second liquid holding part has a first surface that extends in a direction that intersects a surface of the substrate, and a second surface that contacts the first surface and opposes the substrate.

16. An exposure apparatus according to claim 13, wherein the first liquid holding part and the second liquid holding part are disposed so that the second area is formed around the first area, and so that the amount of the liquid held by the second area is specified in accordance with a direction in which the substrate moves during the exposure.

17. An exposure apparatus according to claim 13, wherein the second liquid holding part is configured such that the liquid in the second liquid holding part contacts a gas.

18. An exposure apparatus according to claim 13, wherein the liquid holding member is disposed to oppose the substrate, and the liquid holding member includes the first liquid holding part and the second liquid holding part, and has a groove part formed in a surface opposing the substrate and between the first liquid holding part and the second liquid holding part.

19. An exposure apparatus according to claim 18, wherein a distance between the first liquid holding part and the second liquid holding part is set to five times or more greater than a distance between the substrate and the liquid holding member.

20. An exposure apparatus according to claim 18, wherein at least one of a liquid supply port, which supplies the liquid to the immersion area, and a liquid recovery part, which recovers the liquid from the immersion area, is provided to the liquid holding member.

21. An exposure apparatus according to claim 20, wherein at least one of the liquid supply port and the liquid recovery part is provided to the groove part.

22. An exposure apparatus that exposes a substrate by forming an immersion area by supplying a liquid onto a part of the substrate, and projecting a pattern image onto the substrate through the liquid, the apparatus comprising:
    a liquid holding member for forming the immersion area, wherein the immersion area includes a first area, wherein the liquid is continually held during exposure, and a second area, which is capable of moving with respect to the liquid holding member during the exposure,
    wherein an upper surface of the substrate defines a lower boundary of the first area and the second area of the immersion area, and
    the immersion area is specified by a contact part between the liquid holding member and the liquid, and the liquid of the second area contacts a gas at a circumference of the contact part.

23. A device fabrication method that includes a lithographic process, the method comprising:
    exposing a substrate through the lithographic process with the exposure apparatus according to claim 1.

* * * * *